(12) United States Patent
Terashita et al.

(10) Patent No.: US 10,074,546 B2
(45) Date of Patent: Sep. 11, 2018

(54) PROCESSING LIQUID SUPPLYING APPARATUS AND PROCESSING LIQUID SUPPLYING METHOD

(71) Applicant: Tokyo Electron Limited, Tokyo (JP)

(72) Inventors: Yuichi Terashita, Kumamoto (JP);
Kousuke Yoshihara, Kumamoto (JP);
Koji Takayanagi, Kumamoto (JP);
Toshinobu Furusho, Kumamoto (JP);
Takashi Sasa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 941 days.

(21) Appl. No.: 14/485,914

(22) Filed: Sep. 15, 2014

(65) Prior Publication Data

US 2015/0092167 A1 Apr. 2, 2015

(30) Foreign Application Priority Data

Oct. 2, 2013 (JP) .................................. 2013-207748

(51) Int. Cl.
*B01D 19/00* (2006.01)
*H01L 21/67* (2006.01)

(52) U.S. Cl.
CPC ............................ *H01L 21/67017* (2013.01)

(58) Field of Classification Search
None
See application file for complete search history.

(56) References Cited

U.S. PATENT DOCUMENTS 6,238,576 B1 * 5/2001 Yajima ................... B01D 35/26
210/194
6,848,458 B1 * 2/2005 Shrinivasan .......... B08B 7/0021
134/103.1
(Continued)

FOREIGN PATENT DOCUMENTS

CN 1766734 A 5/2006
CN 101271276 A 9/2008
(Continued)

OTHER PUBLICATIONS

Translation of JP-2008305980-A, accessed Sep. 14, 2017.*
(Continued)

*Primary Examiner* — Amber Rose Orlando
*Assistant Examiner* — Phillip Y Shao
(74) *Attorney, Agent, or Firm* — Abelman, Frayne & Schwab

(57) ABSTRACT

Disclosed is a processing liquid supplying apparatus. The apparatus includes: a processing liquid supply source configured to supply a processing liquid for processing a substrate to be processed; an ejection unit configured to eject the processing liquid to the substrate to be processed; a filter device configured to remove foreign matters in the processing liquid; a supply pump and an ejection pump which are provided in the supply path at a primary side and a secondary side of the filter device, respectively; and a control unit configured to output a control signal to decompress and degas the processing liquid supplied from the processing liquid supply source by using one of the supply pump and the ejection pump, and subsequently, pass the degassed processing liquid through the filter device beginning from the primary side to the secondary side of the filter device by using the supply pump and the ejection pump.

6 Claims, 46 Drawing Sheets

(56) References Cited

U.S. PATENT DOCUMENTS

| | | | |
|---|---|---|---|
| 2006/0075965 A1* | 4/2006 | Lee | G03F 7/016 118/683 |
| 2007/0267065 A1* | 11/2007 | Okumura | F04B 43/073 137/208 |
| 2007/0272327 A1* | 11/2007 | Lin | G03F 7/162 141/286 |
| 2008/0230492 A1* | 9/2008 | Kao | G03F 7/162 210/791 |
| 2014/0097147 A1* | 4/2014 | Yoshida | B01D 19/0036 210/808 |
| 2014/0174475 A1* | 6/2014 | Takayanagi | H01L 21/67017 134/18 |
| 2014/0260963 A1* | 9/2014 | Wang | B01D 35/02 95/8 |

FOREIGN PATENT DOCUMENTS

| | | | | |
|---|---|---|---|---|
| JP | 2000-012449 A | | 1/2000 | |
| JP | 2008305980 A | * | 12/2008 | |
| JP | 2010-135535 A | | 6/2010 | |
| JP | 2011-238666 A | | 11/2011 | |
| JP | 2011238666 A | * | 11/2011 | ....... H01L 21/67017 |
| KR | 10-2013-0049732 A | | 5/2013 | |
| KR | 10-2013-0057984 A | | 6/2013 | |

OTHER PUBLICATIONS

Translation of JP-2011238666-A, accessed Sep. 14, 2017.*
Specification of U.S. Appl. No. 61/787,472, accessed Sep. 14, 2017.*

* cited by examiner

FIG.4
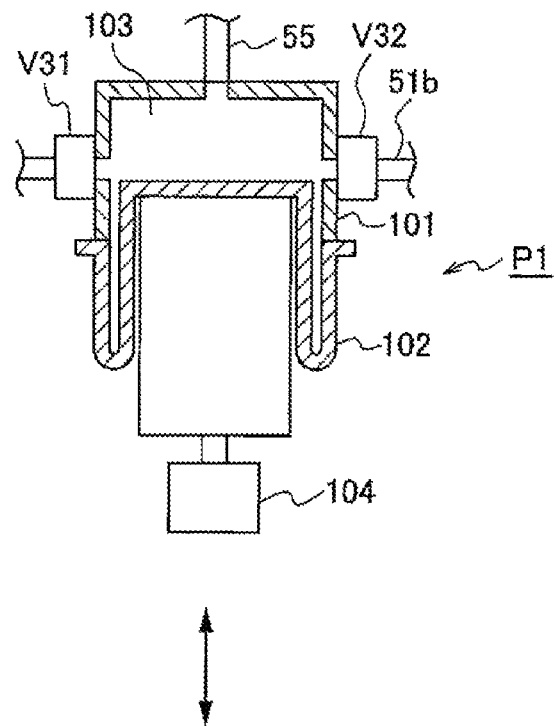
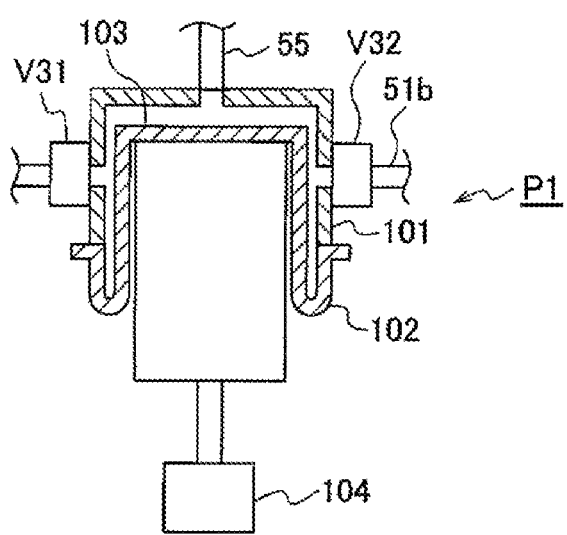

PROCESSING LIQUID SUPPLYING APPARATUS AND PROCESSING LIQUID SUPPLYING METHOD

CROSS-REFERENCE TO RELATED APPLICATIONS

This application is based on and claims priority from Japanese Patent Application No. 2013-207748 filed on Oct. 2, 2013 with the Japan Patent Office, the disclosures of which is incorporated herein in its entirety by reference.

TECHNICAL FIELD

The present disclosure relates to a processing liquid supplying apparatus and a processing liquid supplying method, in which a substrate to be processed such as, for example, a semiconductor wafer or a glass substrate for LCD is processed by supplying a processing liquid.

BACKGROUND

In general, in a photolithography technique for manufacturing a semiconductor device, a semiconductor wafer or a flat panel display (FPD) substrate (hereinafter, referred to as a "wafer") is coated with a photoresist, a resist film formed thereby is exposed along a predetermined circuit pattern, and the exposed pattern is developed to form a circuit pattern on the resist film.

In the photolithography process, a processing liquid such as, for example, a resist liquid or a developer supplied to the wafer may be mixed with bubbles such as nitrogen gas, or particles (foreign matters) by various causes. When the processing liquid mixed with bubbles or particles is supplied to a wafer, unevenness or defects may be caused in coating. Therefore, an apparatus for removing bubbles or particles mixed in the processing liquid is interposed in a conduit of the processing liquid.

Conventionally, as the kind of apparatuses, a processing liquid supplying apparatus is known in which a temporary storage container, a filter, and a pump are interposed in a supply pipe that connects a supply nozzle and a processing liquid storage container, and the processing liquid supplying apparatus includes a circulation pipe that connects the supply pipe and the filter between the processing liquid storage container and the temporary storage container, and a variable throttle that are provided in the circulation pipe (see, e.g., claims, and FIGS. 3 and 4 in Japanese Patent Laid-Open Publication No. 2010-135535). In order to facilitate the efficiency and diversification of processes performed in the photolithography process, the processing liquid supplying apparatus is provided with a plurality of supply nozzles, which are selectively used depending on an intended use.

In the processing liquid supplying apparatus, since gas dissolved in the processing liquid become bubbles when the liquid pressure of the processing liquid which is defoamed by the filter is reduced by the variable throttle, and the bubbles are removed by passing through the filter again via the supply pipe from the circulation pipe. Therefore, the gas dissolved in the processing liquid may be efficiently removed.

SUMMARY

A processing liquid supplying apparatus of the present disclosure includes: a processing liquid supply source configured to supply a processing liquid for processing a substrate to be processed; an ejection unit connected to the processing liquid supply source through a supply path and configured to eject the processing liquid to the substrate to be processed; a filter device provided in the supply path and configured to remove foreign matters in the processing liquid; a supply pump and an ejection pump provided in the supply path at a primary side and a secondary side of the filter device, respectively; and a control unit configured to output a control signal to decompress and degas the processing liquid supplied from the processing liquid supply source by using one of the supply pump and the ejection pump, and subsequently, pass the degassed processing liquid through the filter device beginning from the primary side to the secondary side of the filter device by using the supply pump and the ejection pump.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a schematic view illustrating an operation of a pump constituting the liquid processing apparatus.

DETAILED DESCRIPTION

Figure 1:
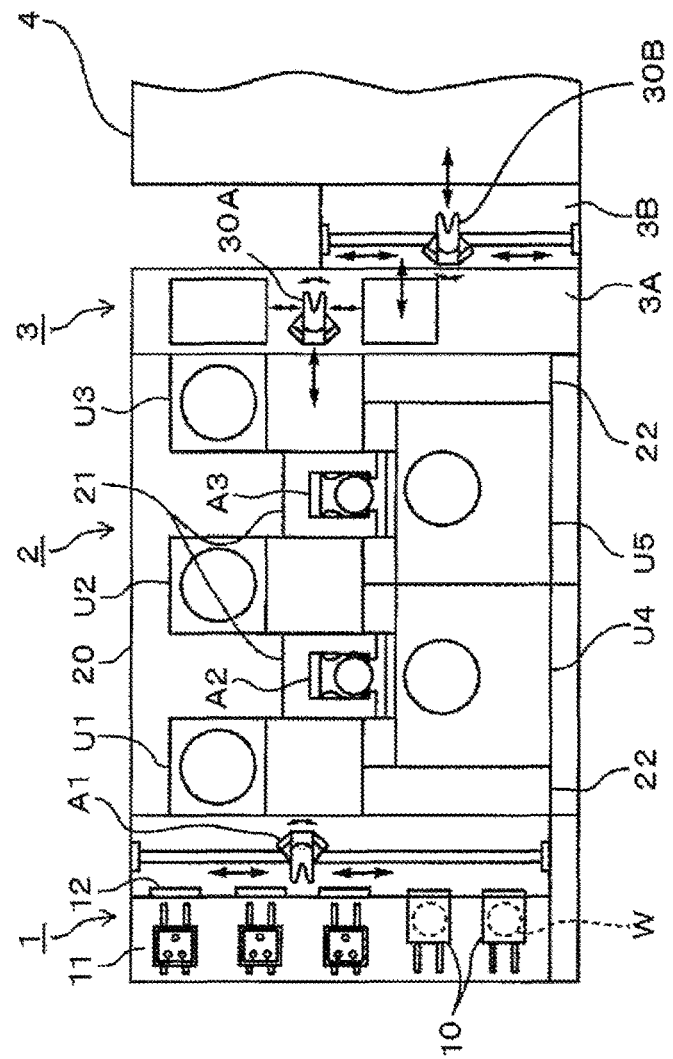
FIG. 1 is a schematic plan view illustrating an entire processing system in which an exposure processing apparatus is connected to a coating and development apparatus to which a liquid processing apparatus according to the present disclosure is applied.

In the following detailed description, reference is made to the accompanying drawings, which form a part hereof. The illustrative embodiments described in the detailed description, drawing, and claims are not meant to be limiting. Other embodiments may be utilized, and other changes may be made, without departing from the spirit or scope of the subject matter presented here.

In the processing liquid supplying apparatus provided with a plurality of supply pipes, the processing liquid remains in a filter interposed in the supply pipe connected with a supply nozzle which is not in use. Here, when the processing liquid remains in a place with a large capacity such as, for example, a filter for a long period of time, bubbles or gels remaining in the filter especially tend to grow and increase as particles at the interface between the filter and the processing liquid. Therefore, in order to prevent the increase of particles mixed in the processing liquid, a method of periodically performing a discharge of the processing liquid in another place, for example, on a wafer, so as to suppress the processing liquid from remaining in a place with a large capacity such as, for example, a filter for long period of time, may be considered (dummy ejection). However, there is a problem in that consumption of the processing liquid increases because the processing liquid ejected in the dummy ejection is discarded. Further, in the processing liquid supplying apparatus as disclosed in Japanese Patent Laid-Open Publication No. 2010-135535, since the bubbles are removed by the filter, the bubbles may remain in the filter device, thereby deteriorating the performance of the filter device.

The present disclosure has been made in consideration of the problem, and an object of the present disclosure is to efficiently suppress the increase of the particles in the processing liquid without wasting the processing liquid.

A processing liquid supplying apparatus according to an exemplary embodiment of the present disclosure includes: a processing liquid supply source configured to supply a processing liquid for processing a substrate to be processed; an ejection unit connected to the processing liquid supply source through a supply path and configured to eject the processing liquid to the substrate to be processed; a filter device provided in the supply path and configured to remove foreign matters in the processing liquid; a supply pump and an ejection pump which are provided in the supply path at a primary side and a secondary side of the filter device, respectively; and a control unit configured to output a control signal to decompress and degas the processing liquid supplied from the processing liquid supply source by using one of the supply pump and the ejection pump, and subsequently, pass the degassed processing liquid through the filter device beginning from the primary side to the secondary side of the filter device by using the supply pump and the ejection pump.

In the above-mentioned processing liquid supplying apparatus, after the supply pump, the filter device and the ejection pump are filled with the processing liquid, the control unit outputs a control signal to establish a space ranging from the supply pump to the ejection pump as a closed decompressed space, stop movement of a driving unit of one of the supply pump and the ejection pump, and cause the other pump to perform an absorption operation, thereby decompressing and degassing the processing liquid.

In the above-mentioned processing liquid supplying apparatus, a circulation path is formed between an ejection side of the ejection pump and a suction side of the supply pump, and the control unit outputs a control signal to return the decompressed and degassed processing liquid from the ejection pump to the supply pump through the circulation path.

In the above-mentioned processing liquid supplying apparatus, the control unit outputs a control signal to repeat a series of steps of decompressing and degassing the processing liquid, subsequently, returning the degassed processing liquid from the ejection pump to the supply pump through the circulation path, and then, passing the degassed processing liquid from the primary side to the secondary side of the filter device, a plurality of times.

In the above-mentioned processing liquid supplying apparatus, the control unit outputs a control signal to return the decompressed and degassed processing liquid from the ejection pump to the supply pump through the filter device.

A processing liquid supplying apparatus according to another exemplary embodiment of the present disclosure includes a processing liquid supply source configured to supply a processing liquid for processing a substrate to be processed; an ejection unit connected to the processing liquid supply source through a supply path and configured to eject the processing liquid to the substrate to be processed; a filter device provided in the supply path and configured to remove foreign matters in the processing liquid; a degassing mechanism configured to degas the processing liquid supplied from the processing liquid supply source; and a liquid feed pump configured to pass the processing liquid degassed by the degassing mechanism through the filter device beginning from a primary side to a secondary side of the filter device.

In the above-mentioned processing liquid supplying apparatus, the degassing mechanism is provided with a decompression mechanism configured to decompress the processing liquid.

In the above-mentioned processing liquid supplying apparatus, the decompression mechanism includes a decompression pump configured to absorb the processing liquid, thereby forming a decompressed space, and the processing liquid supplying apparatus further comprises a control unit configured to output a control signal to close an ejection side of the decompression pump and open a suction side of the decompression pump so that a suction operation is performed.

In the above-mentioned processing liquid supplying apparatus, the suction side of the decompression pump is connected to a trap liquid storage unit configured to trap and discharge bubbles; and the control unit outputs a control signal to close the ejection side of the decompression pump and open the suction side of the decompression pump so that the suction operation is performed and a space ranging from the decompression pump to the trap liquid storage unit is established as a decompressed space.

In the above-mentioned processing liquid supplying apparatus, the trap liquid storage unit is connected with the filter device; and the control unit outputs a control signal to close the ejection side of the decompression pump and open the suction side of the decompression pump so that the suction operation is operated and a space ranging from the decompression pump to the filter device through the trap liquid storage unit is established as a decompressed space.

In the above-mentioned processing liquid supplying apparatus, the suction side of the decompression pump is connected with the filter device, and the control unit outputs a control signal to close the ejection side of the decompression pump and open the suction side of the decompression pump so that the suction operation is performed and a space ranging from the decompression pump to the filter device is established as a decompressed space.

The above-mentioned processing liquid supplying apparatus further includes a circulation path configured to circulate the processing liquid at the secondary side of the filter device back to the primary side of the filter device; and a control unit configured to output a control signal to circulate the processing liquid degassed by the degassing mechanism in the circulation path.

In the above-mentioned processing liquid supplying apparatus, the degassing mechanism is provided in the circulation path.

The above-mentioned processing liquid supplying apparatus further includes a circulation path configured to circulate the processing liquid at the secondary side of the filter device back to the primary side of the filter device; and a control unit configured to output a control signal to circulate the processing liquid degassed by the degassing mechanism in the circulation path. Further, the liquid feed pump is provided at the secondary side of the filter device, the circulation path is connected between an ejection side of the liquid feed pump and the primary side of the filter device, and the liquid feed pump serves as the decompression pump.

In the above-mentioned processing liquid supplying apparatus, the control unit outputs a control signal to circulate the degassed processing liquid a plurality of times.

The above-mentioned processing liquid supplying apparatus further includes a control unit configured to output a control signal to pass the processing liquid degassed by the degassing mechanism through the filter device beginning from the secondary side to the primary side of the filter device, and pass the processing liquid sent to the primary side to the secondary side of the filter device.

The above-mentioned processing liquid supplying apparatus further includes a control unit configured to output a control signal to perform the degassing of the processing liquid by the degassing mechanism and the passage of the processing liquid from the primary side to the secondary side of the filter device when a predetermined time has elapsed after the processing liquid was ejected from the ejection unit.

According to still another exemplary embodiment of the present disclosure, there is provided a processing liquid supplying method in which a processing liquid for processing a substrate to be processed is supplied to the substrate to be processed after passing through a filter device to remove foreign materials. The processing liquid supplying method includes decompressing and degassing the processing liquid supplied from a processing liquid supply source by using one of a supply pump and an ejection pump which are provided at a primary side and a secondary side of the filter device, respectively; passing the degassed processing liquid through the filter device beginning from the primary side to the secondary side of the filter device by using the supply pump and the ejection pump, and ejecting the processing liquid at the secondary side of the filter device to the substrate to be processed through an ejection unit by the ejection pump.

In the above-mentioned processing liquid supplying method, the decompressing and degassing cause a space ranging from the supply pump to the ejection pump to be established as a closed decompressed space, cause movement of a driving unit of one of the supply pump and the ejection pump to be stopped, and cause the other pump to perform an absorption operation, after the supply pump, the filter device, and the ejection pump are filled with the processing liquid.

The above-mentioned processing liquid supplying method further includes forming a circulation path between an ejection side of the ejection pump and a suction side of the supply pump, and returning the decompressed and degassed processing liquid from the ejection pump to the supply pump through the circulation path.

The above-mentioned processing liquid supplying method repeats a series of steps of decompressing and degassing the processing liquid, subsequently, returning the degassed processing liquid from the ejection pump to the supply pump through the circulation path, and then, passing the degassed processing liquid through the filter device beginning from the primary side to the secondary side of the filter device, a plurality of times.

The above-mentioned processing liquid supplying method further includes returning the decompressed and degassed processing liquid from the ejection pump to the supply pump through the filter device.

According to still yet another exemplary embodiment of the present disclosure, there is provided a processing liquid supplying method in which a processing liquid for processing a substrate to be processed is supplied to the substrate to be processed after passing through a filter device to remove foreign materials. The processing liquid supplying method includes degassing the processing liquid sent out from a processing liquid supply source by a degassing mechanism; passing the degassed processing liquid through the filter device beginning from a primary side to a secondary side of the filter device by a liquid feed pump, and ejecting the processing liquid passing from the primary side to the secondary side of the filter device to the substrate to be processed through an ejection unit.

In the above-mentioned processing liquid supplying method, the degassing of the processing liquid by the degassing mechanism decompresses the processing liquid by a decompression mechanism.

In the above-mentioned processing liquid supplying method, the decompressing of the processing liquid by the decompression mechanism closes an ejection side of a decompression pump configured to absorb the processing liquid to form a decompressed space and opens a suction side of the decompression pump so that a suction operation is performed.

In the above-mentioned processing liquid supplying method, the suction side of the decompression pump is connected to a trap liquid storage unit configured to trap and discharge bubbles; and the decompressing of the processing liquid by the decompression mechanism closes the ejection side of the decompression pump and opens the suction side of the decompression pump so that the suction operation is performed and a space ranging from the decompression pump to the trap liquid storage unit is established as a closed decompressed space.

In the above-mentioned processing liquid supplying method, the trap liquid storage unit is connected with the filter device; and the decompressing of the processing liquid by the decompression mechanism closes the ejection side of the decompression pump and opens the suction side of the decompression pump so that the suction operation is performed and a space ranging from the decompression pump to the filter device through the trap liquid storage unit is established as a decompressed space.

In the above-mentioned processing liquid supplying method, the suction side of the decompression pump is connected with the filter device, and the decompressing of the processing liquid by the decompression mechanism closes the ejection side of the decompression pump and opens the suction side of the decompression pump so that the suction operation is performed and a space ranging from the decompression pump to the filter device is established as a decompressed space.

In the above-mentioned processing liquid supplying method, a circulation path is used to circulate the processing liquid at the secondary side of the filter device back to the primary side of the filter device; and the processing liquid degassed by the degassing mechanism is circulated in the circulation path.

In the above-mentioned processing liquid supplying method, the degassing mechanism is provided in the circulation path.

In the above-mentioned processing liquid supplying method, the circulation path is connected between an ejection side of the liquid feed pump and the primary side of the filter device, and the processing liquid at the secondary side of the filter device is circulated back to the primary side of the filter device by using the circulation path, and the liquid feed pump serves as the decompression pump.

In the above-mentioned processing liquid supplying method, the processing liquid degassed by the degassing mechanism passes through the filter device beginning from the secondary side to the primary side of the filter device, and the processing liquid sent to the primary side passes through the filter device to the secondary side of the filter device.

In the above-mentioned processing liquid supplying method, the degassing of the processing liquid by the degassing mechanism and the passage of the processing liquid from the primary side to the secondary side of the filter device are performed when a predetermined time elapses after the processing liquid is ejected from the ejection unit.

According to the present disclosure, the processing liquid degassed by the degassing mechanism passes from the primary side to the secondary side of the filter device. The bubbles included in the filter device are efficiently dissolved in the processing liquid, and efficiently removed to the secondary side of the filter device. Accordingly, the amount of the processing liquid discarded by passing through the filter device is reduced. Further, the bubbles remaining in the filter device may be efficiently suppressed from being mixed as particles in the processing liquid ejected to the substrate to be processed.

Hereinafter, exemplary embodiments of the present disclosure will be described with reference to the accompanying drawings. Here, descriptions will be made on a case where the processing liquid supplying apparatus (a resist liquid processing apparatus) according to the present disclosure is applied to a coating and development apparatus.

Figure 2:
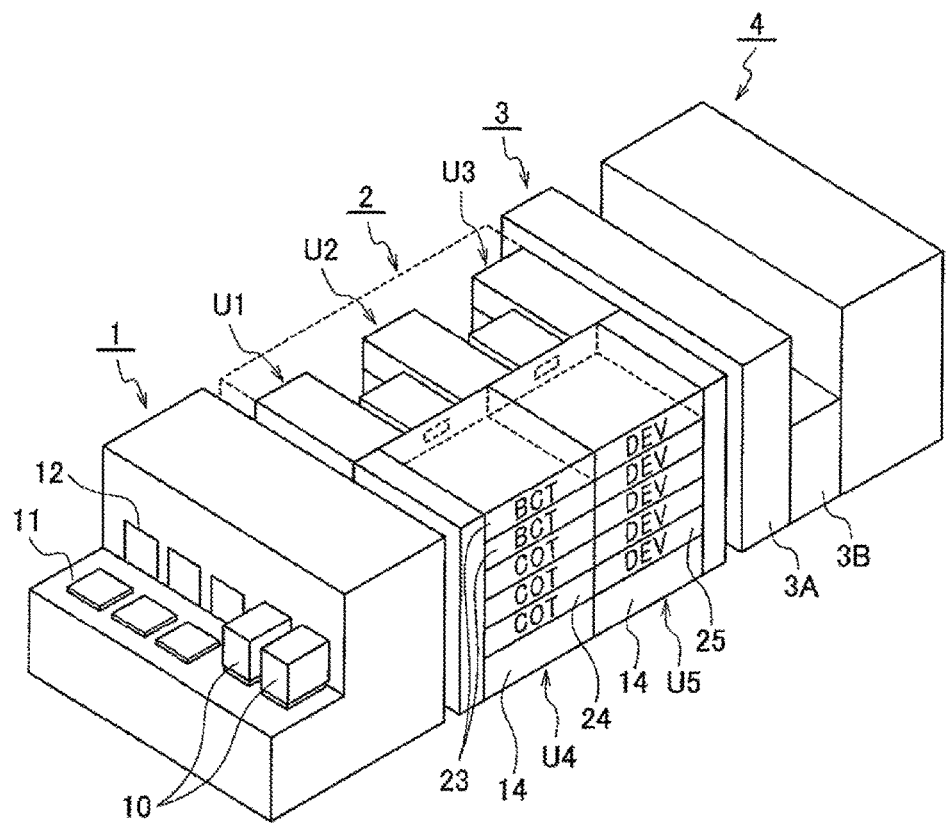
FIG. 2 is a schematic perspective view illustrating the processing system.

As illustrated in FIGS. 1 and 2, the coating and development apparatus is provided with a carrier station 1 configured such that carriers 10 hermetically accommodating a plurality (e.g., 25 sheets) of wafers W serving as substrates are carried into or carried out from the carrier station 1, a processing section 2 configured to perform a resist coating and a development processing on the wafers W taken out from the carrier station 1, and an interface section 3 configured to deliver a wafer W between the processing section 2 and an exposure section 4 that performs liquid-immersion exposure on the surface of the wafer W in a state where a liquid layer transmitting light is formed on the surface of the wafer W.

The carrier station 1 is provided with a placing unit 11 configured to place a plurality of carriers 10 side by side, an opening/closing unit 12 provided on a front wall when viewed from the placing unit 11, and a delivery unit A1 configured to take the wafers W out from the carriers 10 through the opening/closing unit 12.

The interface section 3 is constituted with a first transfer chamber 3A and a second transfer chamber 3B which are provided back and forth between the processing section 2 and the exposure section 4, and formed with a first wafer transfer unit 30A and a second wafer transfer unit 30B, respectively.

Further, the processing section 2 surrounded by a case 20 is connected to an inner side of the carrier station 1. In the processing section 2, main transfer units A2, A3 are provided alternately to deliver the wafers W between each of shelf units U1, U2, U3 of a heating and cooling system, which are arranged in multi-tiers in this order from the front side of the processing section 2, and each of liquid processing units U4, U5. Further, each of the main transfer units A2, A3 is disposed in a space surrounded by a partition wall 21 constituted with one surface portion of the shelf units U1, U2, U3, which are disposed back and forth when viewed from the carrier station 1, and, for example, one surface portion at the right side and a rear portion forming one surface of the left side of the liquid processing units U4, U5. Further, temperature and humidity adjusting unit 22 provided with a temperature adjusting device for the processing liquid or a duct for adjusting temperature and humidity, which is used in each unit, are disposed at a space between the carrier station 1 and the processing section 2 and a space between the processing section 2 and the interface section 3, respectively.

The shelf units U1, U2, U3 are constituted with multi-tiers (e.g., 10 tiers) of various units configured to perform a pre-processing and a post-processing which are performed in the liquid processing units U4, U5, and a combination thereof includes a heating unit (not illustrated) configured to heat (bake) the wafers W and a cooling unit (not illustrated) configured to cool the wafers W. Further, the liquid processing units U4, U5 performing a processing by supplying a predetermined processing liquid to the wafers W are constituted by stacking anti-reflection film coating units (BCT) 23 configured to coat an anti-reflection film on a chemical liquid receiving unit 14 that receives a chemical liquid such as a resist or a developer, coating units (COT) 24 configured to coat a resist liquid on a wafer W, and developing units (DEV) configured to perform a development processing by supplying a developer to the wafer W, in multi-tiers (e.g., 5 tiers), as illustrated in FIG. 2. The coating units (COT) 24 are resist liquid supplying devices.

An example of the flow of the wafers in the coating and development apparatus as described above will be described briefly with reference to FIGS. 1 and 2. In the coating and development apparatus, the wafers W are transferred continuously in each lot. First, when a carrier 10 accommodating, for example, 25 sheets of wafers W is placed on the placing unit 11, a cover of the carrier 10 is removed together with the opening/closing unit 12, and the wafers W are taken out by the transfer unit A1. Then, the wafers W are transferred to the main transfer unit A2 through a delivery unit (not illustrated) constituting one end of the shelf unit U1, subjected to a pre-processing for a coating processing such as, for example, an anti-reflection film forming processing and a cooling processing, and then, coated with a resist liquid in the coating unit (COT) 24. Subsequently, the wafers W are subjected to a heating (bake) processing in the heating unit forming one shelf of the shelf unit U1 or U2, cooled, and then, transferred to the interface section 3 via the delivery unit of the shelf unit U3 by the main transfer unit A2. In the interface section 3, the wafers W are transferred to the exposure section 4 by the first wafer transfer unit 30A of the first transfer chamber 3A and the second wafer transfer unit 30B of the second transfer chamber 3B, and an exposure unit (not illustrated) is disposed to face the surfaces of the wafers W, thereby performing exposure. After the exposure, the wafers W are transferred to the main transfer unit A3 in a reverse path, and developed in the developing unit (DEV) 25 to form a pattern. Thereafter, the wafers W is returned to the original carriers 10 placed on the placing unit 11.

First Exemplary Embodiment

Figure 3:
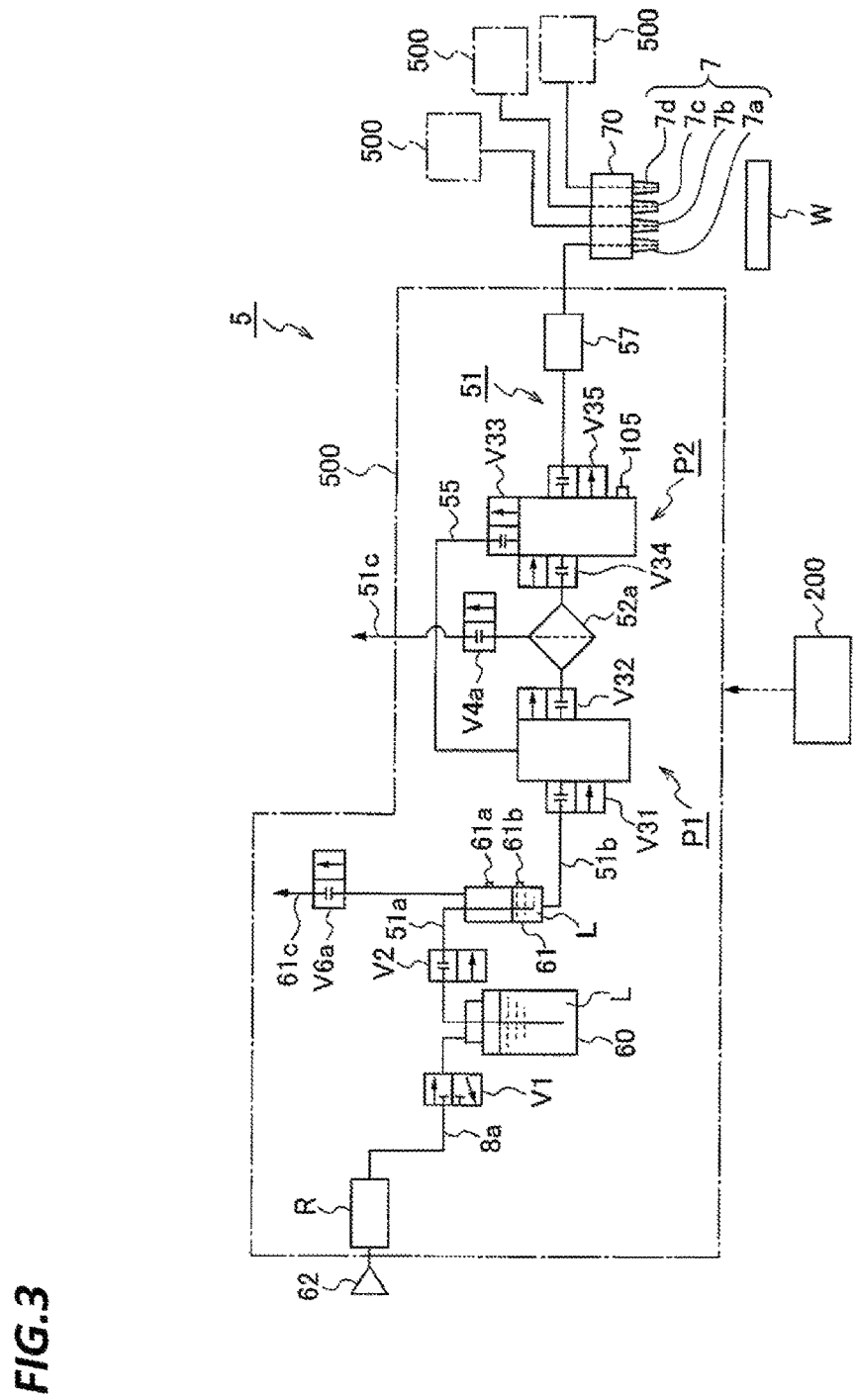
FIG. 3 is a view illustrating a configuration of a first exemplary embodiment of the liquid processing apparatus according to the present disclosure.

Next, a first exemplary embodiment of the processing liquid supplying apparatus according to the present disclosure will be described with reference to FIG. 3. A resist liquid supplying apparatus 5 is constituted by a plurality of resist liquid supplying systems 500. Each resist liquid supplying system 500 is provided with a resist container 60 configured to store a resist liquid L which is a processing liquid, and a processing liquid supply pipe 51 connecting the resist container 60 and a nozzle for ejecting (supplying) the resist liquid L to the wafers W. Further, the resist liquid supplying system 500 is interposed in the processing liquid supply pipe 51 and provided with a filter device 52a configured to filter the resist liquid L to remove bubbles or particles mixed in the resist liquid L. The resist liquid supplying system 500 is further provided with pumps P1, P2 interposed in the processing liquid supply pipe 51 at a primary side and a secondary side of the filter device 52a, respectively, a supply control valve 57 interposed in the processing liquid supply pipe 51 at a secondary side of the pump P2, and a buffer tank 61 interposed in the processing liquid supply pipe 51 at a primary side of the pump P1.

The processing liquid supply pipe 51 is constituted with a first processing liquid supply pipe 51a connecting the resist container 60 serving as a processing liquid supply source and the buffer tank 61 configured to temporarily store the processing liquid guided from the resist container 60, and a second processing liquid supply pipe 51b connecting the buffer tank 61 and the nozzle. That is, the filter device 52a, the pumps P1, P2 and the supply control valve 57 are interposed in the second processing liquid supply pipe 51b. Further, the pumps P1, P2 are connected to each other by a return pipe (circulation path) 55 in addition to the second processing liquid supply pipe 51b.

The pump P1 is a pump configured to supply the resist liquid L to the filter device 52a, and may be referred to as a "supply pump P1" for convenience of explanation. The pump P2 is intended to send the resist liquid L to a nozzle for ejecting the resist liquid L to a wafer W during the liquid processing of the wafer W, and hence, may be referred to as an 'ejection pump P2' for convenience of explanation. FIG. 4 is a schematic vertical cross-sectional view of the supply pump P1. The supply pump P1 is provided with a bottom-opened case 101, and a diaphragm 102 that is formed to block the bottom of the case 101. In the diaphragm 102 of this exemplary embodiment, an outer periphery of a top-closed tub is folded upwardly, so that the diaphragm 102 is connected to the periphery of the case 101.

A pump chamber 103 that stores the resist liquid L is formed by the case 101 and the diaphragm 102. The reference numeral 104 in the figure represents a driving mechanism, and the diaphragm 102 is changed by the driving mechanism 104 as illustrated in the upper and lower portion of FIG. 4, so that the volume of the pump chamber 103 is changed. Therefore, an ejection operation of the resist liquid L from the pump chamber 103 and a liquid suction operation of the resist liquid L to the pump chamber 103 may be performed.

At a suction side (the primary side) of the supply pump P1, an electromagnetic opening/closing valve V31 is provided to allow the flow of the resist liquid L from the second processing liquid supply pipe 51b to the supply pump P1. At an ejection side (the secondary side) of the supply pump P1, an electromagnetic opening/closing valve V32 is provided. Further, a downstream end of the return pipe 55 is connected to the pump chamber 103.

The ejection pump P2 is configured to be substantially similar to the supply pump P1. A different point is that an opening/closing valve V33 is provided as illustrated in FIG. 3, and an upstream end of the return pipe 55 is connected to the ejection pump P2 via the opening/closing valve V33. Further, the ejection pump P2 is provided with a sensor 105 configured to detect a pressure of the pump chamber 103 in the ejection pump P2. Based on the pressure detected by the sensor 105, the operations of the pumps P1, P2 are controlled by a controller 200 through the driving mechanism 104. Meanwhile, since the pressures of the respective pump chambers 103 in the pumps P1, P2 are changed equally when the pump chambers 103 are not partitioned each other by the opening/closing valve, the sensor 105 is also configured to detect the pressure in the pump chamber 103 of the supply pump P1. However, the sensor 105 may be also provided in the pump P1 to control the pressures of the pump chambers 103 based on the detection result of each of the sensors 105. Further, opening/closing valves of the ejection pump P2 corresponding to the opening/closing valves V31, V32 are illustrated as opening/closing valves V34, V35 in FIG. 3.

A flow control valve provided with a dispense valve is used as the supply control valve 57. Further, reference numeral "70" in the figure represents a nozzle unit configured by the nozzle. The nozzle unit 70 is provided with a plurality (four in the figure) of nozzles each connected with the respective resist liquid supplying systems 500. Each nozzle is denoted by reference numeral "7" ("7a" to "7d") in the figure, and different resist liquids L are stored in each resist container 60 of each resist liquid supplying system 500 connected to each of the nozzles 7a to 7d. Accordingly, different resist liquid L may be ejected from each of the nozzles 7a to 7d to the wafers W. A resist liquid L to be ejected in each lot of the wafers W, that is, a resist liquid supplying system 500 to be used is selected by the controller 200.

The upper portion of the resist container 60 is connected with a first gas supply pipe 8a which is connected to a gas supply source 62 of inert gas such as, for example, $N_2$ gas. Further, an electropneumatic regulator R, which is a variably adjustable pressure adjusting unit, is interposed in the first gas supply pipe 8a. The electropneumatic regulator R is provided with an operating unit that is operated by a control signal from the controller 200, for example, a proportional solenoid, and a valve mechanism that is opened or closed by the operation of the solenoid. The electropneumatic regulator R is configured to adjust a pressure by the opening or closing of the valve mechanism.

In the first gas supply pipe 8a, an electromagnetic switching valve V1 is interposed between the electropneumatic regulator R and the resist container 60. Further, an electromagnetic switching valve V2 is interposed between the resist container 60 and the buffer tank 61 of the first processing liquid supply pipe 51a. The switching valve V1 switches the inside of the resist container 60 to any one state among a state of being opened to the air atmosphere, a state of being connected to the gas supply source 62, and a state of being blocked from the air atmosphere and the gas supply source 62. The switching valves V1, V2 and the electropneumatic regulator R also constitute each resist liquid supplying system 500. For example, the gas supply source 62 is shared by the resist liquid supplying systems 500.

The buffer tank 61 is provided with an upper limit liquid level sensor 61a and a lower limit liquid level sensor 61b configured to detect an upper limit liquid level and a lower limit liquid level of the resist liquid L in the buffer tank 61, respectively, which are formed such that the signals detected by the upper limit liquid level sensor 61a and the lower limit liquid level sensor 61b is transmitted to the controller 200. Based on the detection signals, the resist liquid L is supplied from the resist container 60, and the liquid level in the buffer tank 61 is controlled. Further, the upper portion of the buffer tank 61 is provided with a drain pipe 61c configured to remove an air layer in the buffer tank 61 and the resist liquid in the buffer tank 61. An electromagnetic switching valve V6a is interposed in the drain pipe 61c.

The upper portion of the filter device 52a is provided with a ventilation pipe 51c configured to remove (ventilate) a vapor atmosphere in the filter device 52a. An electromagnetic switching valve V4a is interposed in the ventilation pipe 51c.

Figure 5:
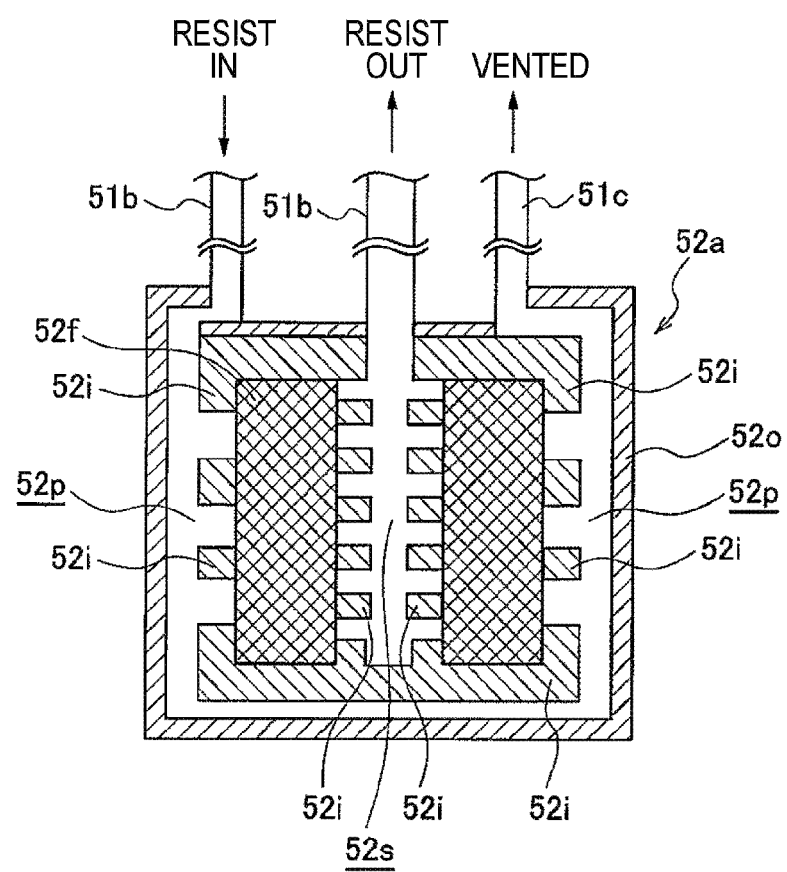
FIG. 5 is a vertical cross-sectional view illustrating a filter device included in the liquid processing apparatus.
Figure 6:
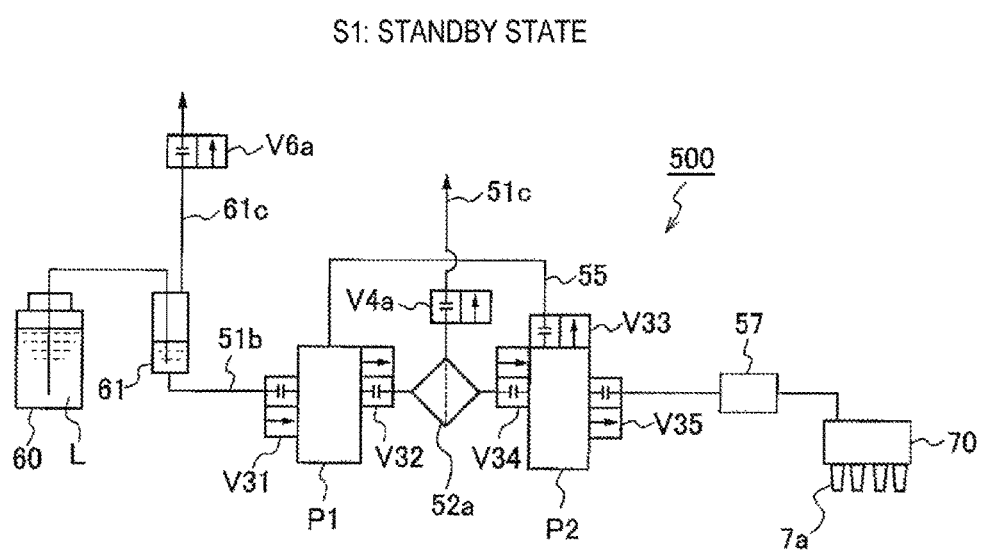
FIG. 6 is an explanatory view illustrating an operation of a resist liquid supply system included in the liquid processing apparatus.

Referring to FIG. 5, the configuration of the filter device 52a will be described. The filter device 52a is constituted mainly with a filter 52f formed in a cylindrical shape, a holding unit 52i configured to surround and hold the filter 52f, and an outer wall 52o. Further, a space 52s is formed in the inner periphery of the filter 52f to be filled with a filtered resist liquid L. A resist liquid passage 52p is formed between the outer wall 52o and the holding unit 52i of the filter device 52a. Further, a secondary side of the resist liquid passage 52p is communicated with the space 52s through the filter 52f. Further, a primary side and a secondary side of the space 52s are communicated with the second processing liquid supply pipe 51b, and the secondary side of the resist liquid passage 52p is communicated with the ventilation pipe 51c.

The filter device 52a is configured to be separable from the second processing liquid supply pipe 51b and the ventilation pipe 51c and exchangeable. Further, the filter 52f is constituted with a membrane member made of, for example, nonwoven fabric, and provided with a plurality of fine holes. The filter 52f is dried when the filter device 52a is attached to the resist liquid supplying system 500. After attachment, the filter 52f is immersed in the resist liquid L, the resist liquid is flowed through each hole, and hence, bubbles and particles included in each hole are removed. Therefore, the resist liquid supplied to the wafers W is suppressed from being contaminated by foreign matters (bubbles and particles) included in the filter 52f itself. Further, as a filling rate of the resist liquid to the holes is higher, that is, a removal rate of the bubbles is higher, when the resist liquid L is supplied to the wafer W, the resist liquid L at the primary side of the filter 52f passes through more holes until the resist liquid L moves to the secondary side of the filter 52f, and the foreign matters included in the resist liquid L are difficult to pass to the secondary side of the filter 52f. That is, the performance of removing foreign matters of the filter 52f is enhanced.

Therefore, a degassed liquid supplying processing is performed in the resist liquid supplying system 500 so as to form a decompressed atmosphere in the supplying system, degas the resist liquid L in the supplying system, and then cause the degassed resist liquid L to flow from the primary side to the secondary side of the filter 52*f* to remove the bubbles of the filter 52*f*. In this processing, when the degassed resist liquid is supplied, the bubbles in the holes of the filter 52*f* are efficiently dissolved in the resist liquid, and the resist liquid is flowed into the holes. And, the dissolved bubbles are discharged along with the resist liquid to the secondary side of the filter 52*f*. Further, in the resist liquid supplying system 500, a circulation and filtration processing is performed, in addition to the degassed liquid supplying processing. The circulation and filtration processing is a processing for securely removing foreign matters from the filter device 52*a* by repeatedly circulating a resist liquid L, which is not degassed in the decompressed atmosphere, in the circulation path including the filter device 52*a* until the resist liquid L is ejected from the nozzles 7*a* to 7*b* to the wafer W.

The controller 200 serving as a control unit will be described. The controller 200 is a computer, and is provided with a program, a memory and a data processing unit including a CPU. The program may transmit a control signal to each resist liquid supplying system 500 to control the opening/closing of each valve, the operation of the electro-pneumatic regulator R and the operation of each of the pumps P1, P2, thereby controlling the flow of the resist liquid or gas in each pipe, the stop of the flow and the flow rate of the resist liquid and gas. Accordingly, the aforementioned degassed liquid supplying processing, the circulation and filtration processing, and the ejection processing of the resist liquid to the wafer W may be performed.

The controller 200 may independently control the resist liquid supplying systems 500 to perform the aforementioned ejection processing in a single resist liquid supplying system 500, while performing the degassed liquid supplying processing or the circulation and filtration processing in other three resist liquid supplying systems 500 in parallel. The program is stored in a storage medium such as, for example, a flexible disc, a compact disc, a hard disc, a magneto-optical (MO) disc, and a memory card, and installed in the controller 200.

Next, referring to FIGS. 6 to 11, which are schematic views of the resist liquid supplying system 500, descriptions will be made on a process in which, after the filter device 52*a* is attached to a single resist liquid supplying system 500, the aforementioned degassed liquid supplying processing is performed before a processing is performed on the wafer W by the resist liquid supplying system 500. In FIGS. 6 to 11, a pipe in which the resist liquid L flows or may flow by the opening/closing of each valve and a change in pressure in the resist liquid supplying system 500 is illustrated more thickly than a pipe in which such a flow does not happen. Further, in order to avoid the figures from being complicated, a part of the configuration as illustrated in FIG. 3 such as, for example, the gas supply pipe 8*a* connected to the resist container 60, is omitted. FIGS. 12 to 16 are explanatory views illustrating states of the pumps P1, P2 and the filter device 52*a* in each process of performing the aforementioned degassed liquid supplying processing, and FIGS. 12 to 16 will also be referred properly.

In a state where the switching valve V6*a* of the drain pipe 61*c* of the buffer tank 61 is opened, the inside of the resist container 60 is pressurized by $N_2$ gas from the gas supply source 62 of $N_2$ gas (see FIG. 3), and the resist liquid L is supplied from the resist container 60 to the buffer tank 61. Then, the switching valve V6*a* is closed, the inside of the buffer tank 61 is also pressurized, and the resist liquid L is supplied to the supply pump P1. Thereafter, the supply of $N_2$ gas is stopped, and the resist liquid L of the buffer tank 61 is supplied to the filter device 52*a* and the ejection pump P2 by the operation of the supply pump P1. The resist liquid L is supplied to the second processing liquid supply pipe 51*b* ranging from the pump P2 to the nozzle 7*a*, and the return pipe 55, and the resist liquid supplying system 500 is in a stand-by state (step S1 in FIG. 6).

In the standby state, each of the opening/closing valves V31 to V35 of the pumps P1, P2, the supply control valve 57, the switching valve V4*a* of the ventilation pipe 51*c* of the filter device 52*a*, and the switching valve V6*a* of the drain pipe 61*c* of the buffer tank 61 are closed. Further, in the standby state, the pump chamber 103 of the supply pump P1 is in an expanded state as illustrated in the upper portion of FIG. 4, and the pump chamber 103 of the ejection pump P2 is in a contracted state as illustrated in the lower portion of FIG. 4.

Figure 7:
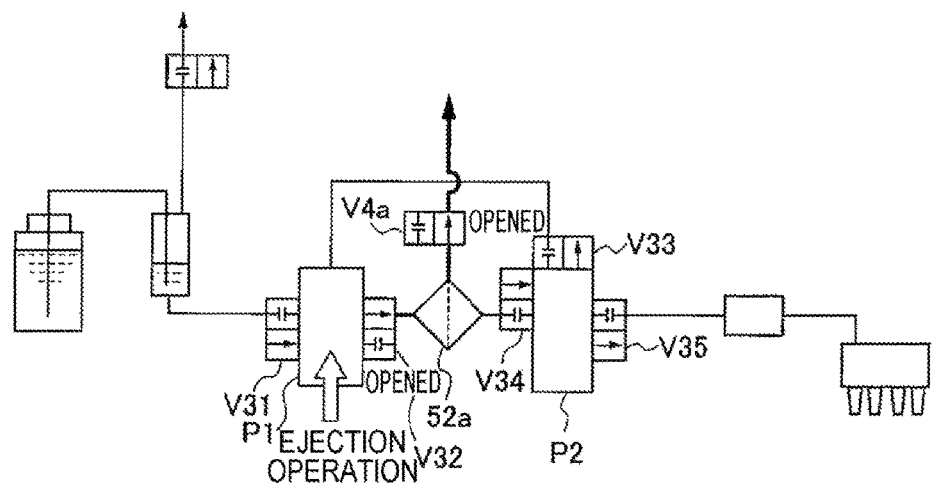
FIG. 7 is an explanatory view illustrating an operation of the resist liquid supply system.
Figure 12:
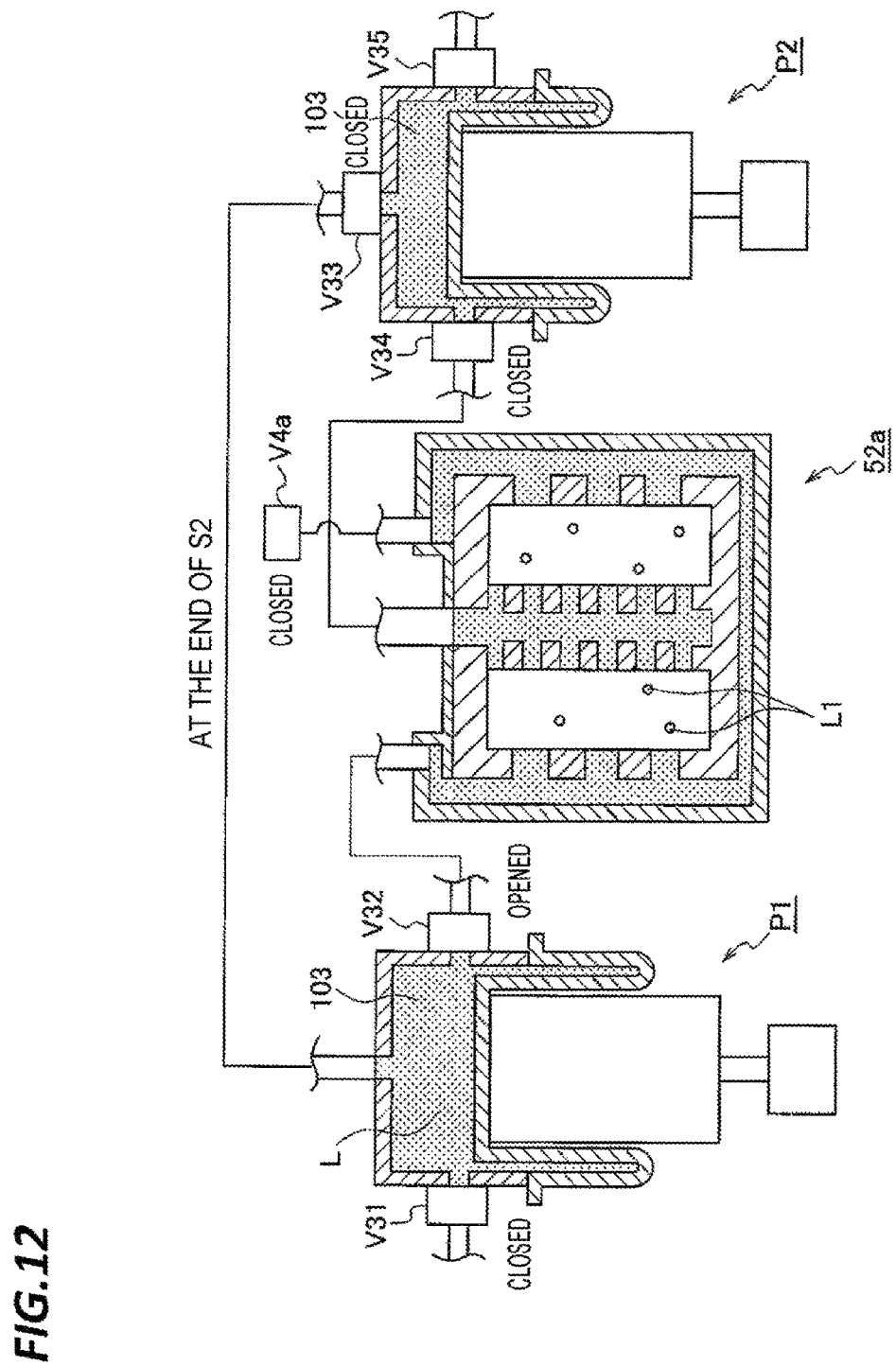
FIG. 12 is an explanatory view illustrating a state of the pump and the filter device.
Figure 13:
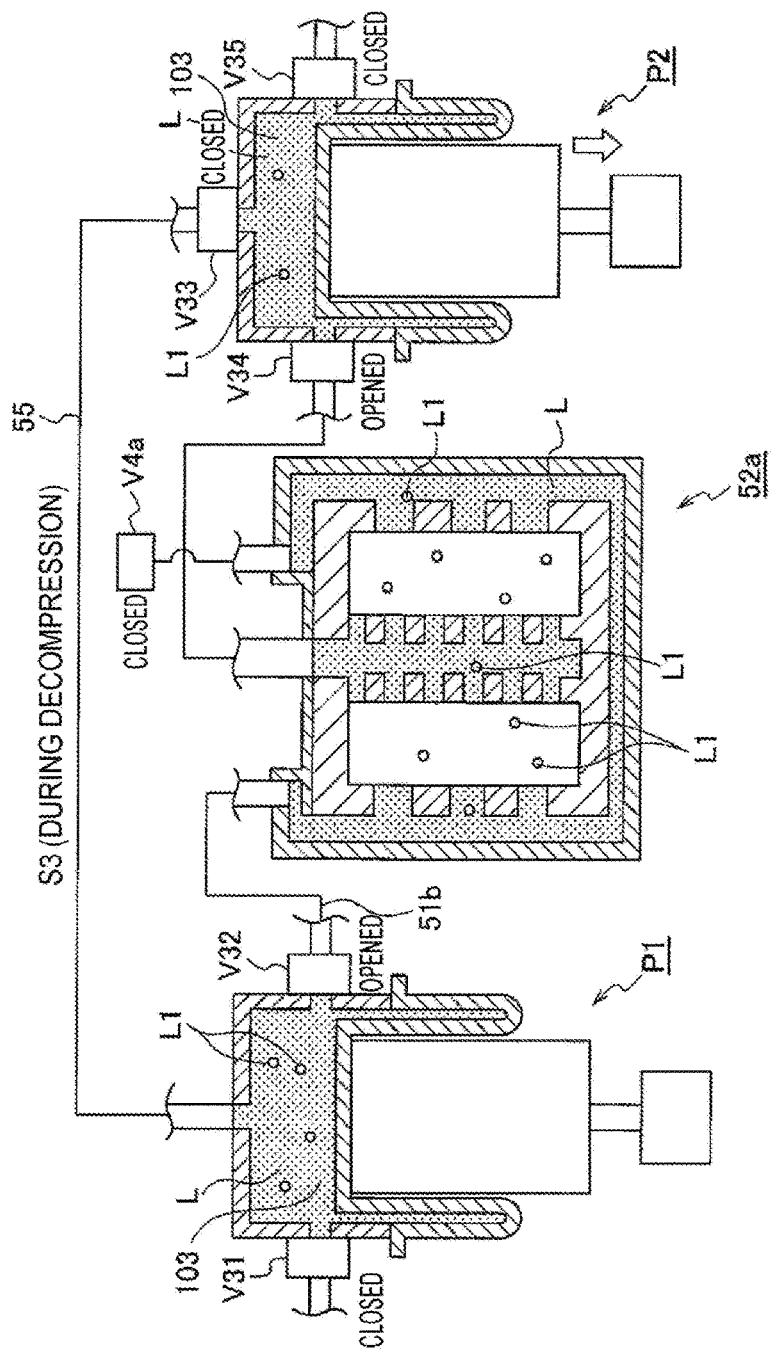
FIG. 13 is an explanatory view illustrating a state of the pump and the filter device.

Subsequently, as illustrated in FIG. 7, the valve V4*a* and the valve V32 at the secondary side (the ejection side) of the supply pump P1 are opened, the supply pump P1 performs the ejection operation of the resist liquid L, the pump chamber 103 is slightly contracted, and hence, the filter device 52*a* is ventilated (step S2). Then, the ejection operation is stopped, the valve V32 is closed, and the ventilation is completed. FIG. 12 illustrates the pumps P1, P2 and the filter device 52*a* at the end of the ventilation.

Figure 8:
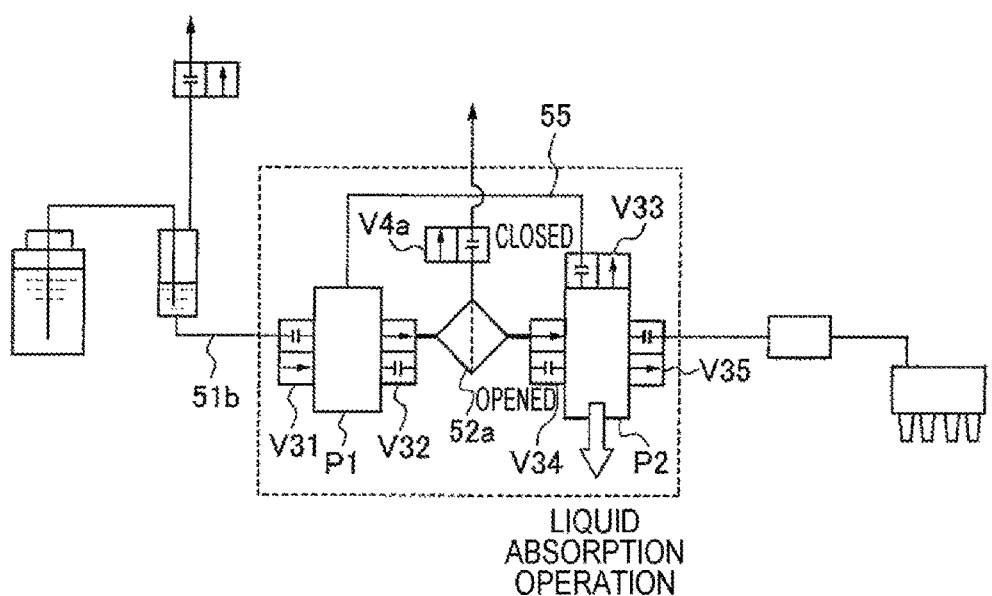
FIG. 8 is an explanatory view illustrating an operation of the resist liquid supply system.

Subsequently, as illustrated in FIG. 8, in a state where the operation of the supply pump P1 is stopped, the valve V34 at the primary side (the suction side) of the ejection pump P2 and the valve V32 at the secondary side of the supply pump P1 are opened, and the ejection pump P2 starts a liquid absorption operation. That is, in a state where the volume of the pump chamber 103 of the supply pump P1 is constant, the pump chamber 103 of the ejection pump P2 is expanded. At this time, a region surrounded by dotted lines in FIG. 8, that is, the pump chambers of the pump P1, P2, the inside of the filter device 52*a*, a region in the second processing liquid supply pipe 51*b* ranging from the pump P1 to the pump P2, and the return pipe 55 form a sealed space, and the inside of the sealed space is decompressed by the expansion of the pump chamber 103 of the ejection pump P2 (step S3). When decompression is performed in this manner, bubbles L1 dissolved in the resist liquid L in the sealed space are generated, and the degassing of the resist liquid L proceeds.

Figure 9:
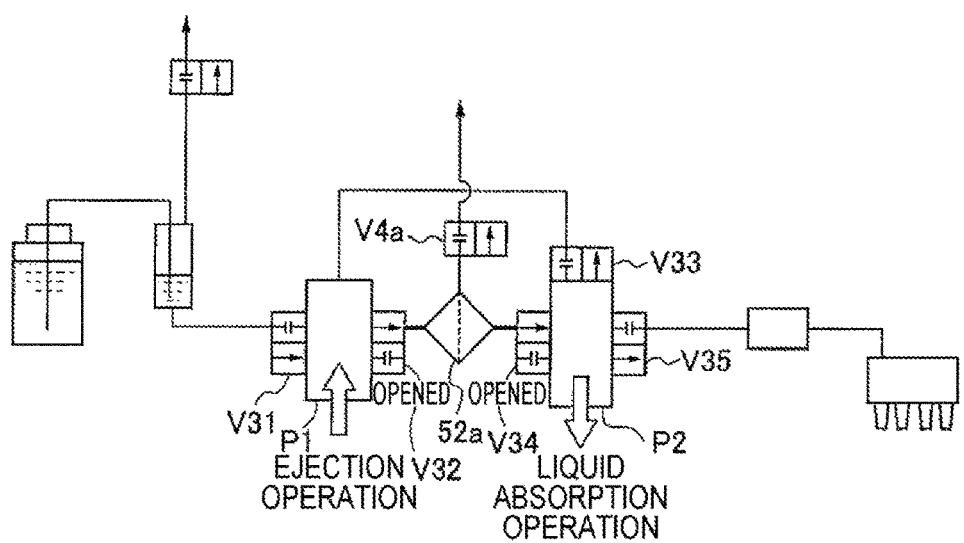
FIG. 9 is an explanatory view illustrating an operation of the resist liquid supply system.
Figure 14:
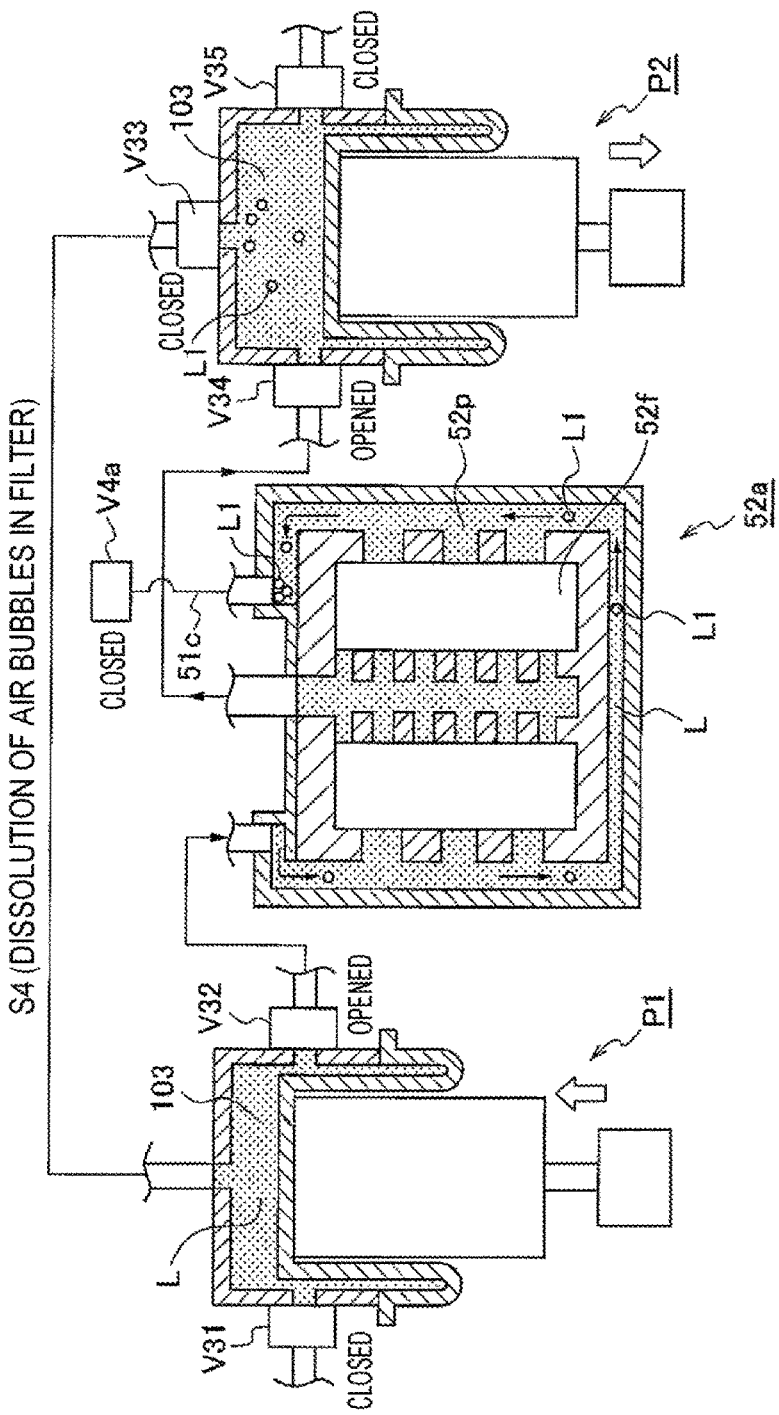
FIG. 14 is an explanatory view illustrating a state of the pump and the filter device.

Subsequently, as illustrated in FIG. 9, while the liquid absorption operation is continued, the ejection operation of the supply pump P1 is performed, and the resist liquid L of the supply pump P1 passes through the filter device 52*a* to be filtered, and sent to the ejection pump P2 (step S4). As the pump chamber 103 of the supply pump P1 is contracted, the decompressed state of the sealed space is released. Here, as the resist liquid L is supplied to the filter 52*f* at the upstream side of the filter 52*f*, the bubbles L1 included in the filter 52*f* as described above is dissolved in the resist liquid L, and this resist liquid L passes through the holes of the filter 52*f* and is supplied to the secondary side (the ejection pump P2 side). Particles adhered to the filter 52*f* also flow to the secondary side of the filter 52*f* by the resist liquid L. As illustrated in FIG. 14, the filter 52*f* does not pass the bubbles L1 flowing along with the resist liquid L from the primary side thereof, and the bubbles L1 are stored in the resist liquid passage 52*p* at the primary side and form an air layer above the resist liquid passage 52*p*.

Figure 10:
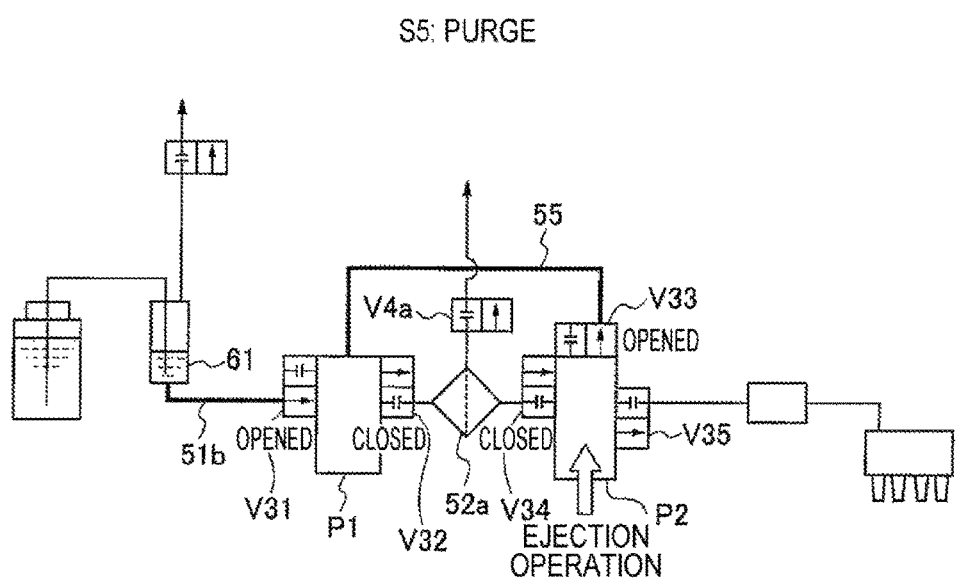
FIG. 10 is an explanatory view illustrating an operation of the resist liquid supply system.
Figure 15:
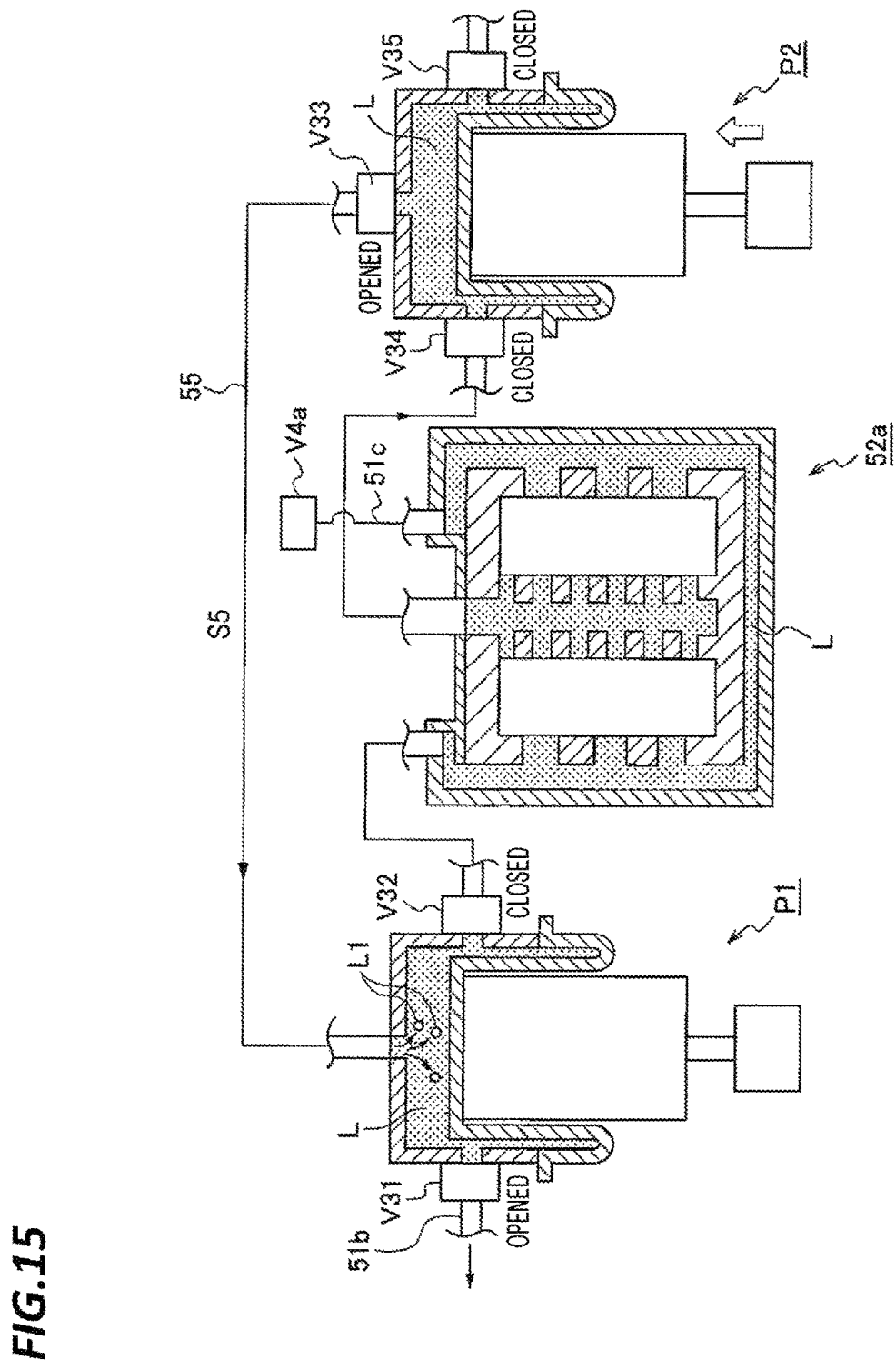
FIG. 15 is an explanatory view illustrating a state of the pump and the filter device.
Figure 16:
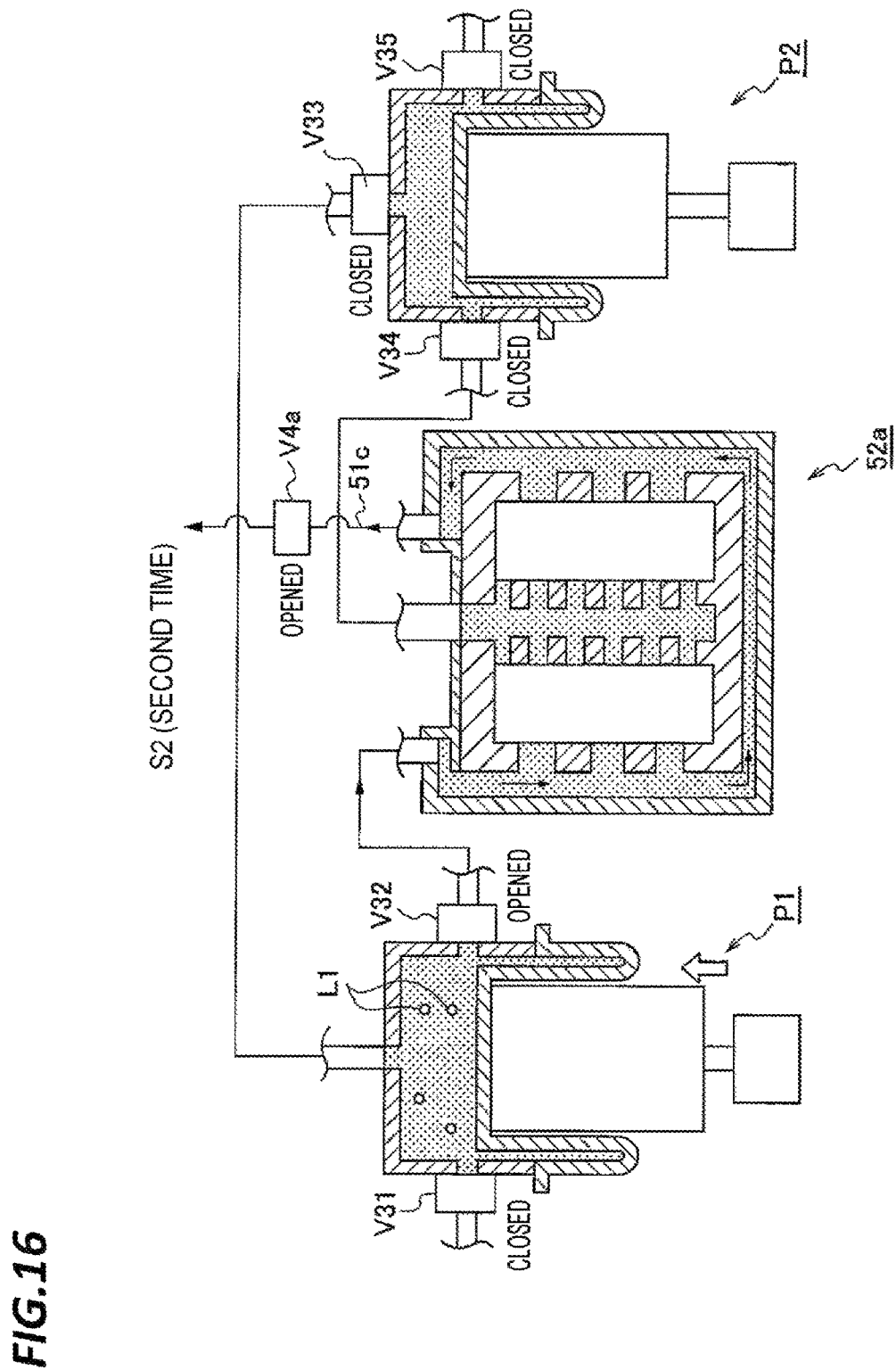
FIG. 16 is an explanatory view illustrating a state of the pump and the filter device.

For example, when the supply pump P1 ejects the resist liquid L completely and the ejection pump P2 absorbs the resist liquid L completely, the valve V32 at the secondary side of the supply pump P1 and the valve V34 at the primary side of the ejection pump P2 are closed. Subsequently, the valve V33 connected to the return pipe 55 of the ejection pump P2 and the valve V31 at the primary side of the supply pump P1 are opened, and the ejection operation of the ejection pump P2 starts as illustrated in FIG. 10. Accordingly, as illustrated in FIG. 15, the resist liquid L in the ejection pump P2 is purged along with the bubbles L1 or the particles flowed out from the filter 52f to the second processing liquid supply pipe 51b at the upstream side of the filter 52f, particularly the pump chamber 103 of the supply pump P1 and the upstream side of the supply pump P1 through the return pipe 55 (step S5).

Figure 11:
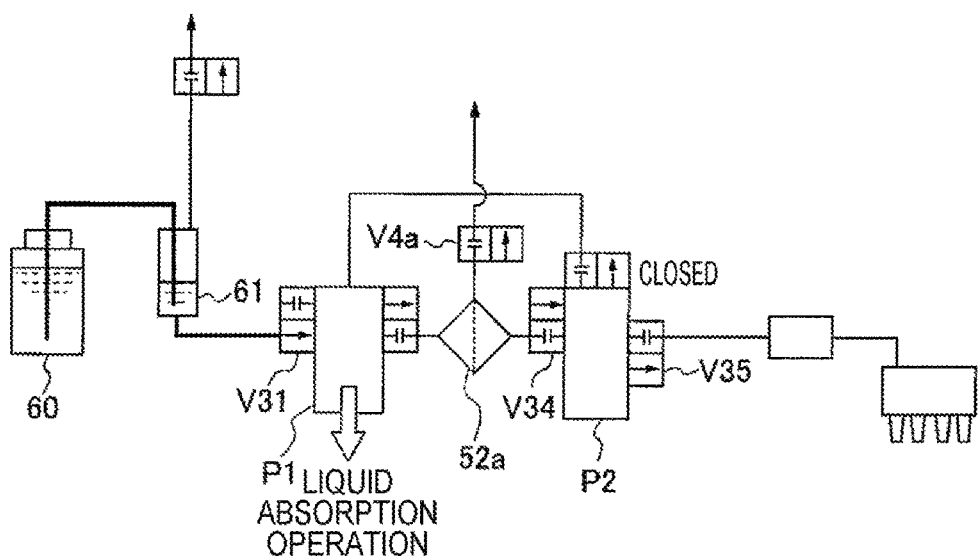
FIG. 11 is an explanatory view illustrating an operation of the resist liquid supply system.

For example, when the ejection pump P2 ejects the resist liquid L completely, the valve V33 is closed, the liquid absorption operation of the supply pump P1 starts as illustrated in FIG. 11, and the resist liquid L supplied from the primary side is refilled in the supply pump P1 (step S6). When the supply pump P1 absorbs the resist liquid L completely, the valve V31 at the primary side of the supply pump P1 is closed, and the resist liquid supplying system 500 is in the standby state of step S1.

After step S1, steps S2 to S6 are performed in the same manner. Referring to step S2 at the second time, when decompression and filtration are performed in the aforementioned steps S3, S4 at the first time, the bubbles L1 are accumulated in the filter device 52a to form an air layer as illustrated in FIG. 14. The air layer is removed from the filter device 52a through the ventilation pipe 51c by performing step S2 at the second time (see FIG. 16). Further, as illustrated in FIG. 15, the resist liquid L including particles is supplied to the supply pump P1 in step S5 at the first time. When ventilation is performed in step S2 at the second time, the resist liquid L is supplied to the filter device 52a and removed along with the air layer from the ventilation pipe 51c.

In step S3 at the second time, the formed closed space is decompressed, and the bubbles L1 are generated in the resist liquid L, as in step S3 at the first time. Then, in step S4 at the second time, filtration is performed as in step S4 at the first time. During the filtration, the bubbles L1 are not able to pass through the filter 52f, and are accumulated by forming an air layer in the flow path of the filter device 52a as described above. The air layer is removed from the filter device 52a during the ventilation in step S2 at the third time. Further, in step S4 at the second time, a resist liquid L which did not shift from the supply pump P1 to the filter device 52a in step S2 at the second time shifts to the filter device 52a. Particles in the resist liquid L do not pass through the filter 52f and are collected by the filter 52f. And, the bubbles L1 of the filter 52f are dissolved in the degassed resist liquid L and the resist liquid L flows into the holes of the filter 52f during the filtration in step S4 at the second time as in step S4 at the first time.

After steps S5, S65 at the second time are performed, steps S1 to S6 are performed again. Steps S1 to S6 are repeated in this way and thus, the removal of foreign matters from the filter 52f proceeds. When step S1 to S6 are repeated a predetermined number of times, the degassed liquid supplying processing is completed and the resist liquid supplying system 500 is maintained, for example, in a standby state of step S11 as described below. Meanwhile, the ventilation in step S2 is not limited to being performed every time. Whenever step S3 is performed, the amount of the bubbles L1 generated in step S3 is reduced. Therefore, in order to enhance the processing speed, the number of times of performing the ventilation may be reduced as the degassed liquid supplying processing proceeds. Particularly, for example, when steps S1, S3 to S6 are performed repeatedly 20 times, that is, in 20 cycles, step S2 may be performed every time for the first to tenth cycles, and then, step S2 may be performed in every even-numbered cycle for the eleventh to twentieth cycles.

Subsequently, referring to FIGS. 17 to 21, descriptions will be made on an ejection processing of the resist liquid L to the wafers W, which is performed after the degassed liquid supplying processing. In FIGS. 17 to 21, a pipe in which the resist liquid L flows is illustrated more thickly than a pipe in which the resist liquid L does not flow, as in FIGS. 6 to 11. The ejection processing will be described with reference to the operation of a resist liquid supplying system 500 connected to the nozzle 7a in a case where wafers W set to be processed in the resist liquid supplying system 500 are transferred to the resist liquid supplying apparatus 5, as an example.

Figure 17:
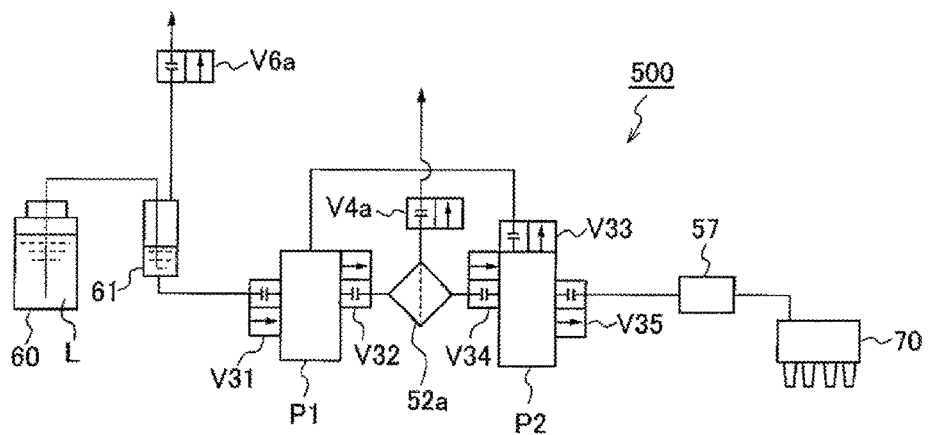
FIG. 17 is an explanatory view illustrating an operation of the resist liquid supply system.

FIG. 17 illustrates the resist liquid supply system 500 in a standby state after the degassed liquid supplying processing (step S11). The opened/closed state of each opening/closing valve in the standby state S11 at the time of the ejection processing is the same as that in the standby state S1 at the time of the degassed liquid supplying processing. In the aforementioned standby state S1, the ejection pump P2 has been described as being in a state where the resist liquid is ejected completely. However, in the standby state S11, the ejection pump P2 is in a state where a predetermined amount of the resist liquid L of the supply pump P1 is transferred to the ejection pump P2 through the filter device 52a, for example, by the operation of the pumps P1, P2, and the opening or closing of each nozzle from the standby state S1 such that the resist liquid is ejected to the wafers W in the subsequent step S12.

Figure 18:
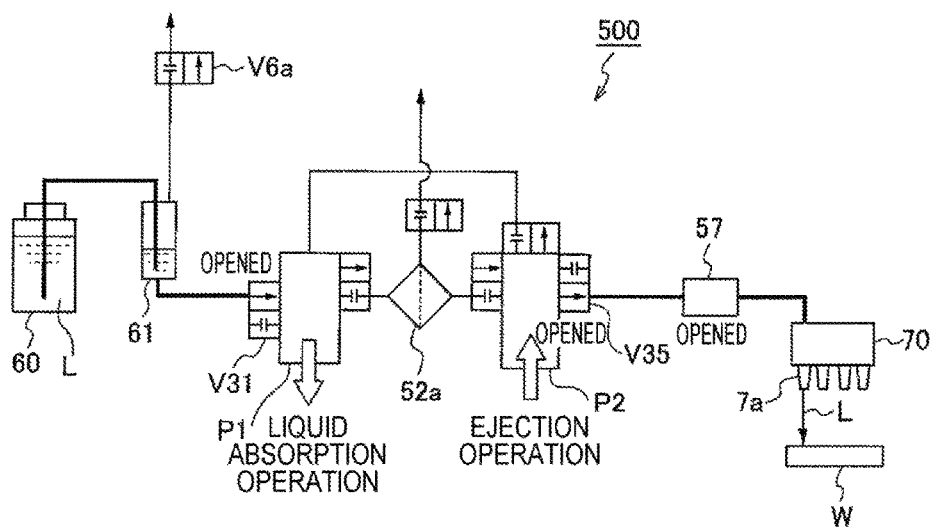
FIG. 18 is an explanatory view illustrating an operation of the resist liquid supply system.
Figure 19:
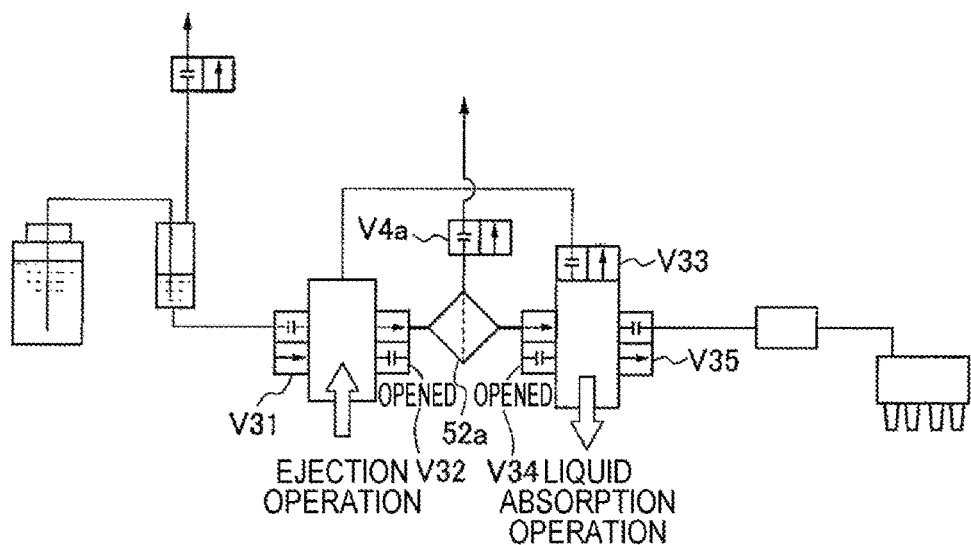
FIG. 19 is an explanatory view illustrating an operation of the resist liquid supply system.
Figure 20:
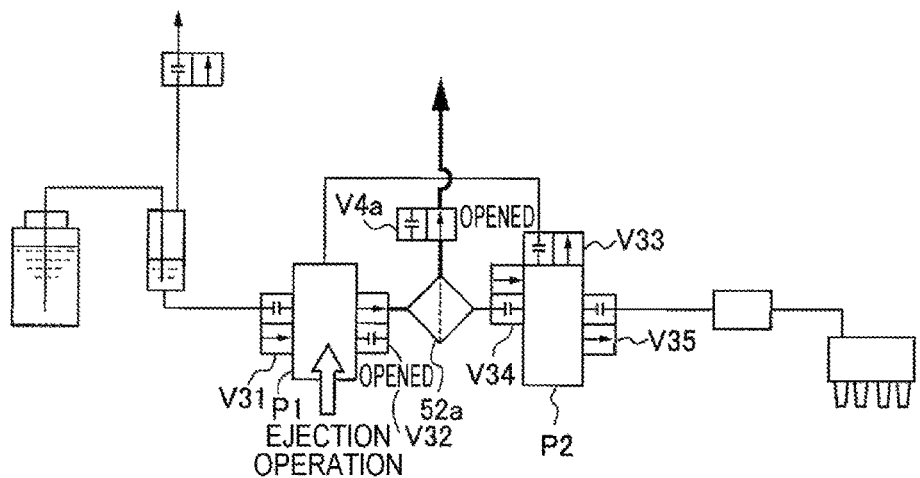
FIG. 20 is an explanatory view illustrating an operation of the resist liquid supply system.
Figure 21:
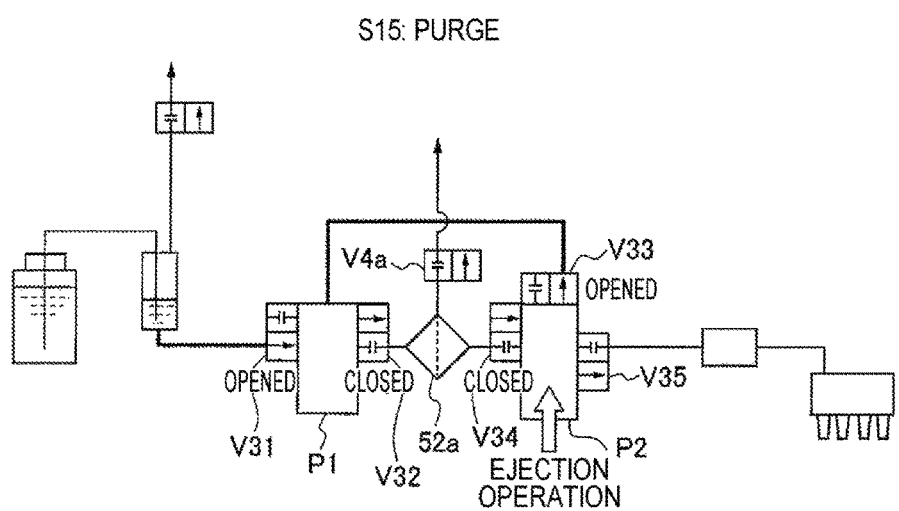
FIG. 21 is an explanatory view illustrating an operation of the resist liquid supply system.

When the wafers W are carried into the resist liquid supplying apparatus 5, as illustrated in FIG. 18, the ejection pump P2 of the resist liquid supplying system 500 starts the ejection operation, and the valve V35 at the secondary side of the ejection pump P2 and the supply control valve 57 are opened to eject the resist liquid L to the wafers W. The ejection amount of the resist liquid L to the wafer W is set to, for example, 1 mL. When the ejection to a single wafer W is completed, the valve V35 and the supply control valve 57 are closed. Wafers W in the same lot as that of the processed wafers W are transferred continuously one by one to the resist liquid supplying apparatus 5, and each time, the valve V35 and the supply control valve 57 are opened or closed and the ejection operation of the ejection pump P2 is performed, thereby performing the ejection of the resist liquid on the wafers W. Simultaneously with the ejection of the resist liquid to the wafers W, the valve V31 at the primary side of the supply pump P1 is opened such that the supply pump P1 performs a liquid absorption operation, and the resist liquid L is supplied from the resist container 60 to the supply pump P1 (step S12).

When all the wafers W in the lot are processed, or the ejection pump P2 ejects the resist liquid L completely, the opening/closing of each valve and the operations of the pumps P1, P2 are performed, and the resist liquid L of the supply pump P1 is filtered by the filter device 52a and supplied to the ejection pump P2 (step S13 in FIG. 19), as in step S4 of the aforementioned degassed liquid supplying processing. After all the wafers W in the lot are processed and step S13 is performed, the opening/closing of each valve and the ejection operation of the supply pump P1 are performed, and ventilation of the filter device 52a is performed (step S14 in FIG. 20), as in step S2 of the degassed liquid supply processing.

Then, the opening/closing of each valve and the ejection operation of the ejection pump P2 are performed, and the purge of the resist liquid L from the ejection pump P2 to the supply pump P1 is performed (step S15 in FIG. 21), as in step S5 of the degassed liquid supplying processing. The purge is performed in order to more securely suppress any foreign matters from being mixed in the resist liquid ejected to the wafers W. After the completion of step S15, the resist liquid supplying system 500 is in the standby state of step S11. Then, when wafers W in the subsequent lot, which are set to be processed in the resist liquid supplying system 500 of the nozzle 7a, are carried into the resist liquid supplying apparatus 5, processings of steps S12 to S15 are performed in the same manner.

However, also in the ejection processing of the resist liquid, the ventilation of step 14 is not limited to being performed whenever steps S11 to S13 are performed. That is, when step S15 is usually set to be performed after steps S11 to S13, and this cycle is performed once or a plurality of times, step S14 may be set to be performed between step S13 and step S15 in the next cycle. When the processing is performed in this manner, the processing speed may be reduced.

Figure 22:
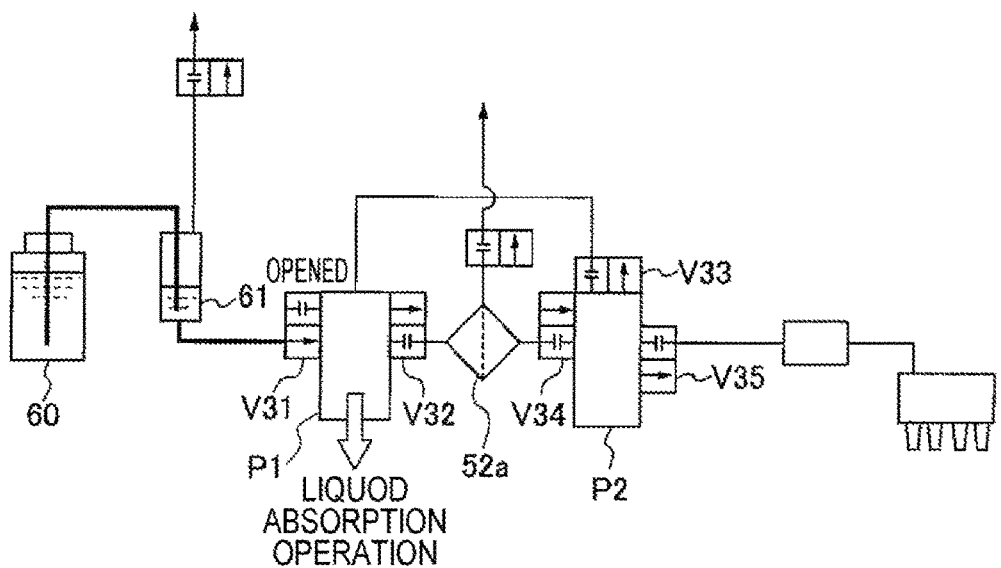
FIG. 22 is an explanatory view illustrating an operation of the resist liquid supply system.
Figure 23:
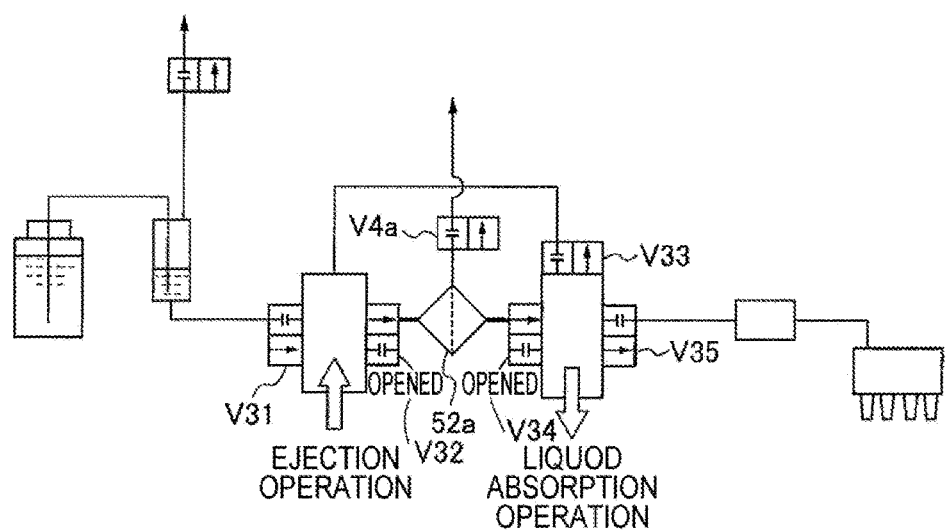
FIG. 23 is an explanatory view illustrating an operation of the resist liquid supply system.
Figure 24:
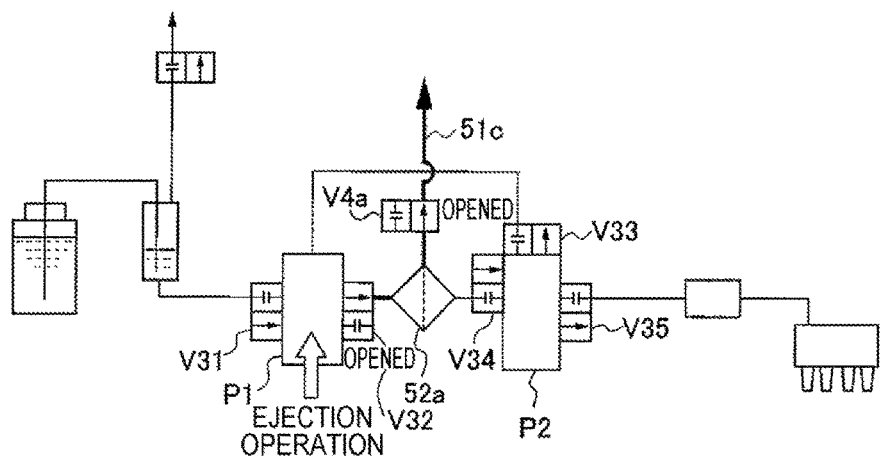
FIG. 24 is an explanatory view illustrating an operation of the resist liquid supply system.
Figure 25:
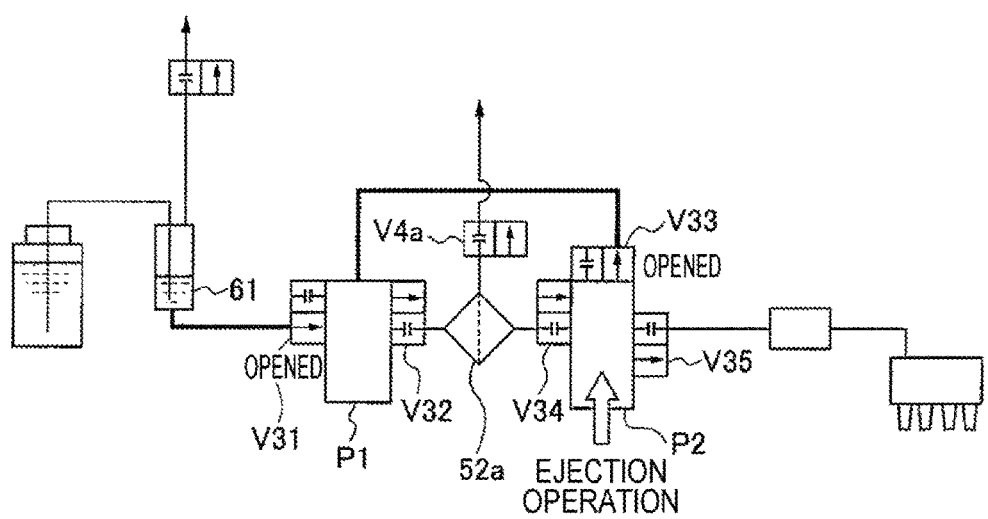
FIG. 25 is an explanatory view illustrating an operation of the resist liquid supply system.

Subsequently, the circulation and filtration processing will be described with reference to FIGS. 22 to 25. With respect to the resist liquid supplying system 500 in the standby state of step S11 (see FIG. 17), the valve V31 at the primary side of the supply pump P1 is opened and the absorption operation of the supply pump P1 is performed as illustrated in FIG. 22 (step S21). Then, the resist liquid L of the supply pump P1 is filtered in the filter device 52a and supplied to the ejection pump P2 (step S22 in FIG. 23), as in steps S4, S13 as described above.

Thereafter, the ventilation of the filter device 52a is performed (step S23 in FIG. 24), as in steps S2, S14. Then, the purge of the resist liquid L from the ejection pump P2 to the supply pump P1 is performed (step S24 in FIG. 25), as in step S4. In each of steps S22 to S24, the opening/closing of each valve and the operations of the pumps P1, P2 are controlled, as in each step S corresponding to the aforementioned degassed liquid supplying processing and ejection processing. After step S24, steps S21 to S24 are performed repeatedly. For example, assuming that steps S21 to S24 are one cycle, after one cycle is completed, the next cycle is performed at predetermined intervals, for example, at intervals of about 15 minutes.

When steps S21 to S24 are performed in this manner, the resist liquid is suppressed from remaining in the filter 52f, as described with respect to the problems in the prior art. Accordingly, bubbles or gels remaining in the filter 52f may be suppressed from growing and increasing as particles at the interface between the filter 52f and the processing liquid L. Further, since steps S21 to S24 are repeated and the resist liquid L repeatedly passes through the filter device 52a, foreign matters in the resist liquid L are removed more securely by the filter device 52a.

However, in step S24, the operation of the ejection pump P2 is controlled such that the amount of the resist liquid L purged from the ejection pump P2 (the purge amount) is equal to or more than the ejection amount of the resist liquid to a single wafer W in the ejection processing. Controlling the purge amount in this manner is intended to relatively increase the amount of the resist liquid flowing through the filter 52f in order to ensure the effect of suppressing the increase of particles. However, also in the circulation and filtration processing, the ventilation of step S23 is not limited to being performed whenever steps S21, S22 are performed. When steps S21, S22, S24 are performed a plurality of times, the ventilation of step S23 may be performed once while steps S22, S24 are performed.

Figure 26:
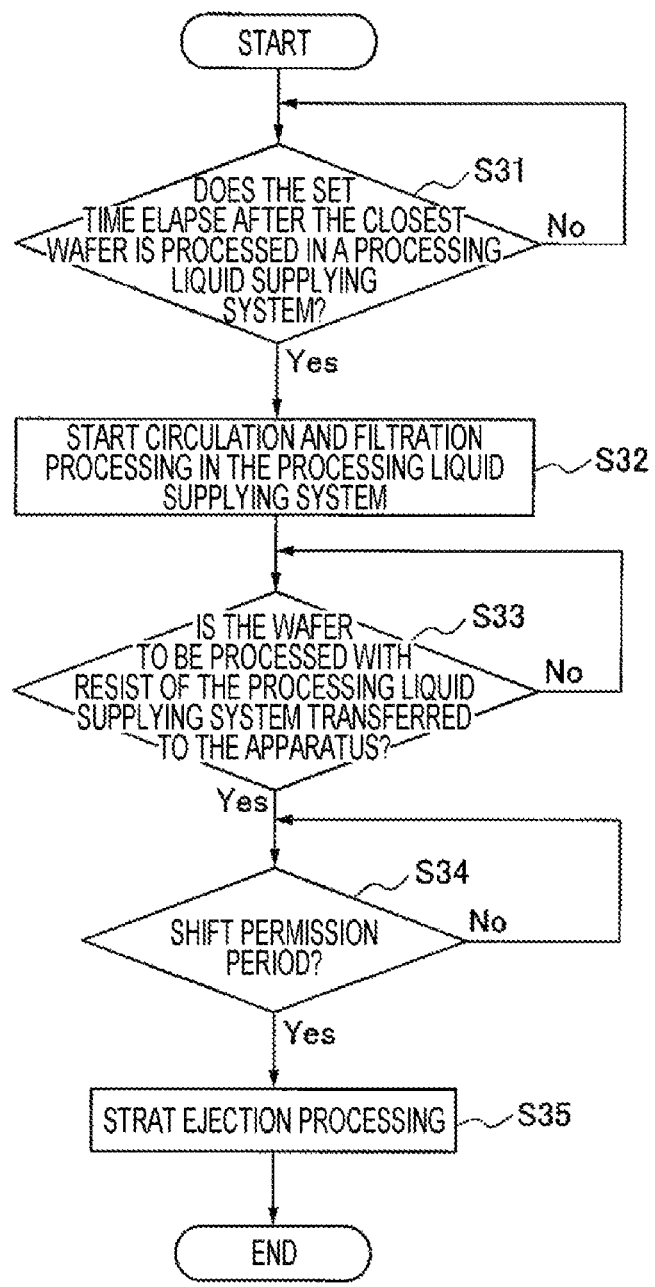
FIG. 26 is a determination flowchart of a controller configured to operate the resist liquid supply system.

An example of a timing when the circulation and filtration processing is performed will be described with reference to a flowchart of FIG. 26. The controller 200 determines whether a preset time has elapsed after resist ejection was performed on the closest wafer W in a single resist liquid supplying system 500. That is, it is determined whether a set time has elapsed after a control signal was lastly transmitted to eject the resist liquid L to the ejection pump P2 in the closest step S12 (see FIG. 18) (step S31). When it is determined that the set time has not elapsed, the determination of step S21 is performed repeatedly.

When it is determined that the set time has elapsed, the circulation and filtration processing starts in the resist liquid system 500. That is, the operations described in steps S21 to S24 (see FIGS. 22 to 25) are performed (step S32). Then, it is determined whether the wafers W set to be processed in the resist liquid supplying system 500 during the circulation and filtration processing were transferred to the resist liquid supplying apparatus 5 (step S33). When it is determined that the wafers W were not transferred, the determination of step S33 is performed repeatedly, while the circulation and filtration processing is performed continuously. For example, when it is determined that the wafers W were not transferred to the resist liquid supplying apparatus 5 even at a timing of performing a liquid refilling to the supply pump P1 of t step S21 (see FIG. 22) at the next time after the completion of the purge of step S24 (see FIG. 24), step S21 is performed. That is, steps S21 to S24 are performed repeatedly.

When it is determined that the wafers W were transferred to the resist liquid supplying apparatus 5 in step S33, it is determined whether it is a shift permission period to stop the circulation and filtration processing and shift to the ejection processing (step S34). The shift permission period is, for example, a period from a time of completing the purge of step S24 to a time of starting the next step S21, and when it is determined that it is the shift permission period is, the circulation and filtration processing is completed. Then, according to the aforementioned steps S11 to S15 (see FIGS. 17 to 21), the ejection processing of the resist liquid L to the transferred wafers W is performed (step S35).

For example, when it is determined that it is out of the shift permission period in step S34, the circulation and filtration processing is continued, while the determination of step S34 is performed repeatedly. When the circulation and filtration processing proceeds and the purge of step S24 is completed, it is determined that it is the shift permission period in step S34, and the ejection processing of the resist liquid of step S35 starts.

The shift permission period is not limited to the aforementioned example, but may be a period of shifting from one step to the next step during a time period from step S21 to S24 in one cycle, that is, a time period other than a time period in which each step S is executed.

However, when the filter device 52a is used continuously, bubbles L1 may be accumulated in the filter 52f. In order to remove the bubbles L1, the degassed liquid supplying processing may be performed according to step S21 to S35 of the flowchart, instead of the circulation and filtration processing. That is, the degassed liquid supplying processing is not limited to being performed when the filter device 52a is attached to the resist liquid supplying system 500. In a case where the degassed liquid supplying processing is performed instead of the circulation and filtration processing, the shift permission period of the resist liquid to the ejection processing corresponds to, for example, a time period in which the process is in the standby state of step S1 (see FIG. 6).

Although an example of performing the circulation and filtration processing after the set time has elapsed after the ejection processing has been described, the timing of performing the circulation and filtration processing is not limited to the example. For example, in a case where a step of determining whether the preset time has elapsed after the degassed liquid supplying processing was completed, and then, it is determined that the set time has elapsed in the step, the steps after step S32 of the flowchart of FIG. 26 may be performed so that the circulation and filtration processing is performed.

According to the resist liquid supplying apparatus 5, a space constituted by the pumps P1, P2, the filter device 52a, and the processing liquid supply pipe 51 is closed by valves to form a sealed space, and the sealed space is decompressed by the liquid absorption operation of the ejection pump P2. Accordingly, fine bubbles present in the resist liquid are actualized, and the resist liquid is degassed. The degassed resist liquid is flowed from the primary side to the secondary side of the filter device 52a such that the bubbles included in the filter 52 are dissolved in the resist liquid. Therefore, since the bubbles are efficiently removed, the bubbles may be suppressed from being mixed as particles in the resist liquid ejected to the wafers W, and the performance of collecting foreign matters in the filter device 52a may be suppressed from being lowered by the bubbles. Further, a waste of the resist liquid may be suppressed, and the running cost of the apparatus may be reduced, as compared with a case in which the bubbles are removed by performing a dummy ejection which causes the resist liquid to continuously flow from the resist container 60 to the nozzle unit 70 through the filter device 52a.

Further, in the resist liquid supplying apparatus 5, the aforementioned steps S1 to S6 are repeated, and hence, the degassing of the resist liquid by the decompression, and the flowing of the resist liquid to the filter device 52a through the circulation path including the return pipe 55 and the processing liquid supply pipe 51 are performed repeatedly a plurality of times. As a result, the removal of bubbles in the filter 52f may be performed more securely.

Further, when the ejection processing of the resist liquid and the degassed liquid supplying processing are not performed, the circulation and filtration processing is performed. Since the bubbles of the filter device 52a are removed more securely by the circulation and filtration processing as described above, particles may be suppressed from being mixed in the resist liquid ejected to the wafers W. Further, the amount of the dummy ejection for removing the bubbles may be reduced more securely by the processing.

The timing of performing the circulation and filtration processing is not limited to the above examples. For example, the timing may be set such that, when the wafer W is transferred to the resist liquid supplying apparatus 5, the circulation and filtration processing is performed, and after steps S21 to S24 are performed, for example, once, the ejection processing of the resist liquid of steps S11 to S15 is performed. However, as illustrated in the flowchart of FIG. 26, in a case where the circulation and filtration processing is performed after the set time has elapsed after the resist liquid was ejected to the wafers W, the time loss until the ejection processing of the resist liquid starts may be reduced, and the throughput may be enhanced.

Further, simultaneously with performing the circulation and filtration processing or the degassed liquid supplying processing in one resist liquid supplying system 500, the ejection processing of the resist liquid to the wafers W may be performed in another resist liquid supplying system 500. Since each resist liquid supplying system 500 is controlled in this manner, the timing of starting the ejection processing of the resist liquid may be suppressed from being delayed due to the circulation and filtration processing and the degassed liquid supplying processing, and hence, the productivity of the resist liquid supplying apparatus 5 may be suppressed from being lowered.

Further, in the resist liquid supplying apparatus 5, since the pumps P1, P2 are disposed at the primary side and the secondary side of the filter device 52a, respectively, the inner pressure of the filter device 52a is easy to adjust. More specifically, during the degassed liquid supplying processing, the decompressed space may be formed as described above. When the filtration is performed in the ejection processing of the resist liquid, the supply pump P1 performs the ejection operation at the primary side of the filter device 52a, while the ejection pump P2 performs the liquid absorption operation at the secondary side of the filter device 52a. Accordingly, since the inner pressure of the filter device 52a is reduced, the resist liquid may be suppressed from foaming in the filter device 52a. That is, bubbles are suppressed from being mixed in the resist liquid during the ejection of the resist liquid to the wafers W.

Second Exemplary Embodiment

Figure 27:
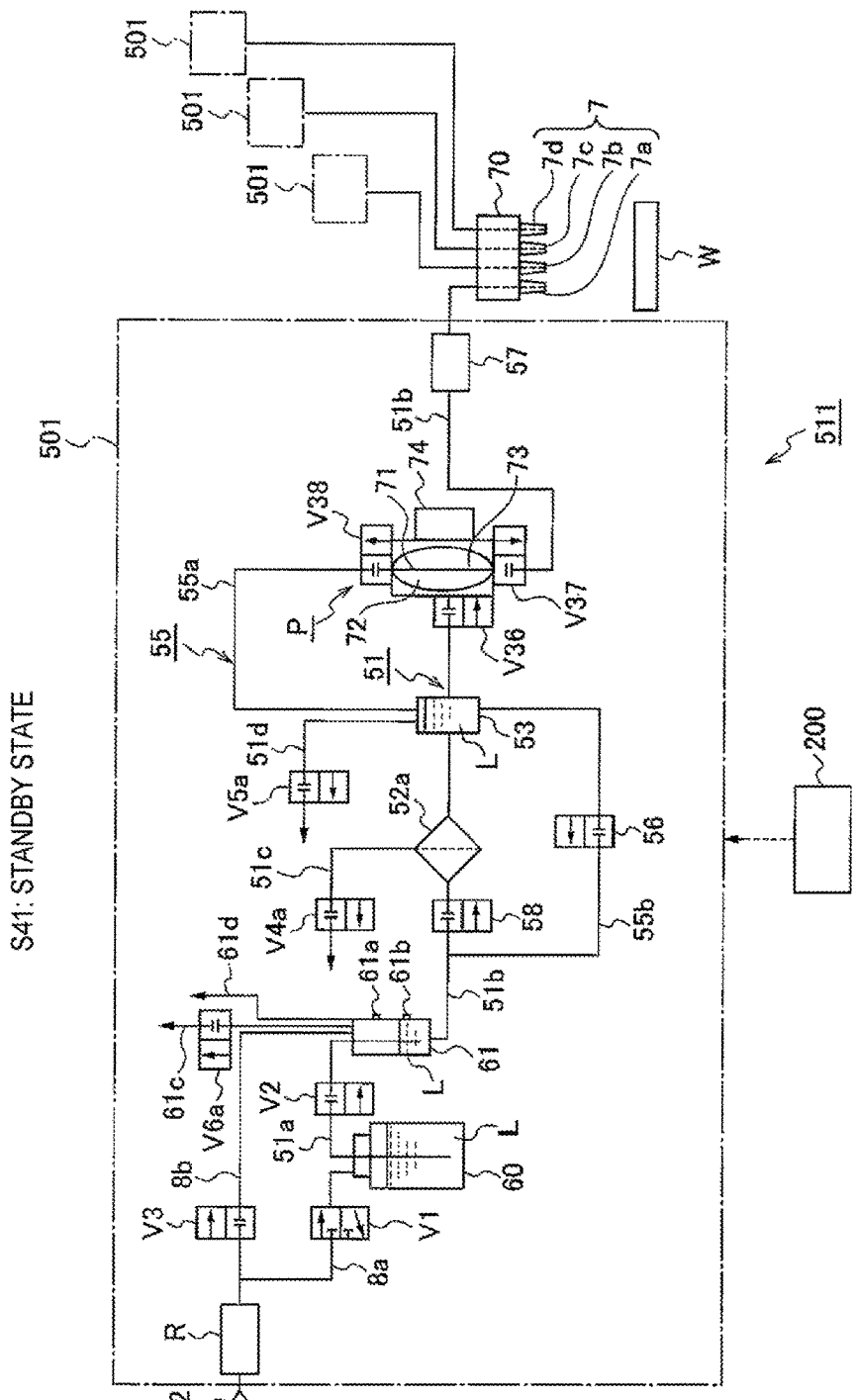
FIG. 27 is a view illustrating a configuration of a resist liquid supply system according to another liquid processing apparatus.

A resist liquid supplying apparatus 521 of the second exemplary embodiment will be described with reference to FIG. 27. In the second exemplary embodiment and the subsequent exemplary embodiments, the same reference numerals are given to the same parts as those in the first exemplary embodiment, and the descriptions thereof are omitted. The resist liquid supplying apparatus 511 is provided with resist liquid supplying systems 511 in place of the resist liquid supplying systems 500. Each resist liquid supplying system 501 is provided with a trap tank 53 interposed in a processing liquid supply pipe 51 at a secondary side of a filter device 52a, a pump P interposed in the processing liquid supply pipe 51 at a secondary side of the trap tank 53, and a return pipe 55 connecting an ejection side of the pump P and a suction side of the filter device 52a.

The return pipe 55 includes a first return pipe 55a connecting the trap tank 53 and the pump P, and a second return pipe 55b connecting the trap tank 53 and a second processing liquid supply pipe 51b at a primary side of the filter device 52a. Further, a switching valve 56 is interposed in the second return pipe 55b. In the processing liquid supply pipe 51, a switching valve 58 is interposed between a connecting portion with the second return pipe 55b and the filter device 52a.

The trap tank 53 serving as a trap liquid storage unit stores a resist liquid like a buffer tank 61, and trapped gas is accumulated above the inside of the trap tank 53. A ventilation pipe 51d is provided above the trap tank 53 to remove the gas in the tank, and a switching valve V5a is interposed in the ventilation pipe 51d. Further, the reference numeral 8b in the figure represents a second gas supply pipe connecting a gas supply source 62 and the buffer tank 61 through an electropneumatic regulator R, and a switching valve V3 is interposed in the second gas supply pipe 8b. The reference numeral 61d represents a pipe to prevent the buffer tank 61 from being pressurized excessively. A valve is interposed in the pipe, but the illustration of the valve is omitted because the valve is always opened in each step to be described later.

As the pump P, a diaphragm pump is used to absorb or eject a processing liquid in the second processing liquid supply pipe 51b. The pump P is partitioned into a pump chamber 72 corresponding to a pump portion and an operation chamber 73 corresponding to a driving portion by a diaphragm 71 that is a flexible member. A suction port is formed at a primary side of the pump 2 to absorb the processing liquid in the second processing liquid supply pipe 51b, and an electromagnetic opening/closing valve V36 is provided at the primary side (the suction side) of the pump P.

For convenience, an ejection port of the pump P is illustrated in the figure to be formed in two places, but the ejection port is actually formed in one place. A pipe connected to the ejection port is branched to constitute the processing liquid supply pipe 51b and the return pipe 55. And, the pipes branched thereby are provided with electromagnetic opening/closing valves V37, V38, respectively, to control the supply of the resist liquid from the pump P to each of the pipes 51b, 55. The operation chamber 73 is connected with a driving unit 74 which is provided with an electropneumatic regulator configured to control decompression and compression of gas in the operation chamber 73 based on a signal from a controller 200. The pump P serves as a liquid feed pump configured to pass the resist liquid from the primary side to the secondary side of the filter device 52a as well as a decompression pump configured to form a decompressed space.

A degassed liquid supplying processing, an ejection processing of the resist liquid and a circulation and filtration processing are also performed with respect to each resist liquid supplying system 501 in the resist liquid supplying apparatus 511, as in the first exemplary embodiment. The degassed liquid supplying processing will be described with reference to FIG. 27 described above and FIGS. 28 to 34. FIG. 27 illustrates a standby state of the resist liquid supplying system 5014. Each valve as illustrated in the figure is closed in the standby state. The resist liquid L is supplied from the resist container 60 up to a nozzle unit 70, and the pump P is in a state where the resist liquid L is absorbed (step S41).

Figure 28:
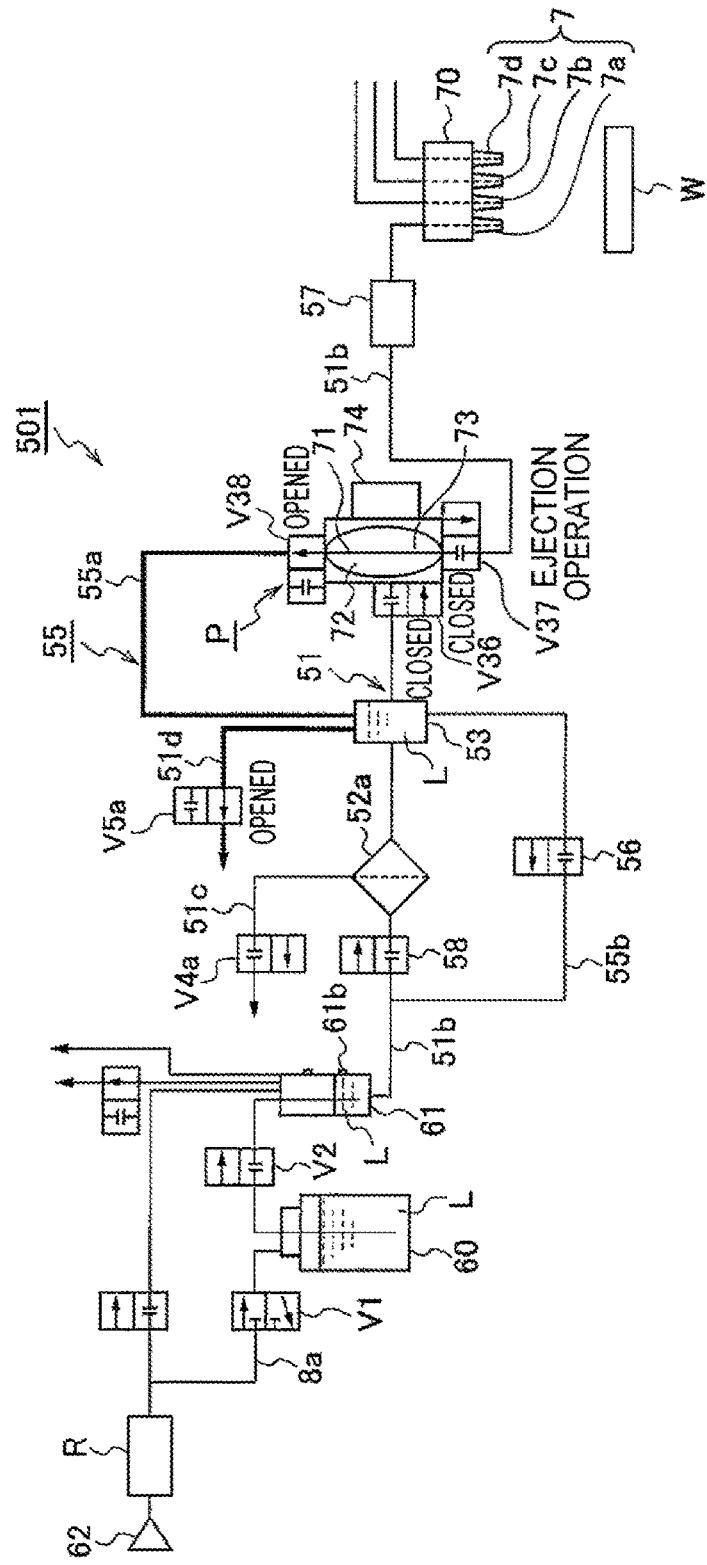
FIG. 28 is an explanatory view illustrating an operation of the resist liquid supply system.

From the standby state, the valve V38 at the secondary side of the pump P and the valve V5a of the ventilation pipe 51d of the trap tank 53 are opened, and the ejection operation of the pump P is performed (FIG. 28). Accordingly, the gas trapped in the trap tank 53 is removed from the ventilation pipe 51d (step S42).

Figure 29:
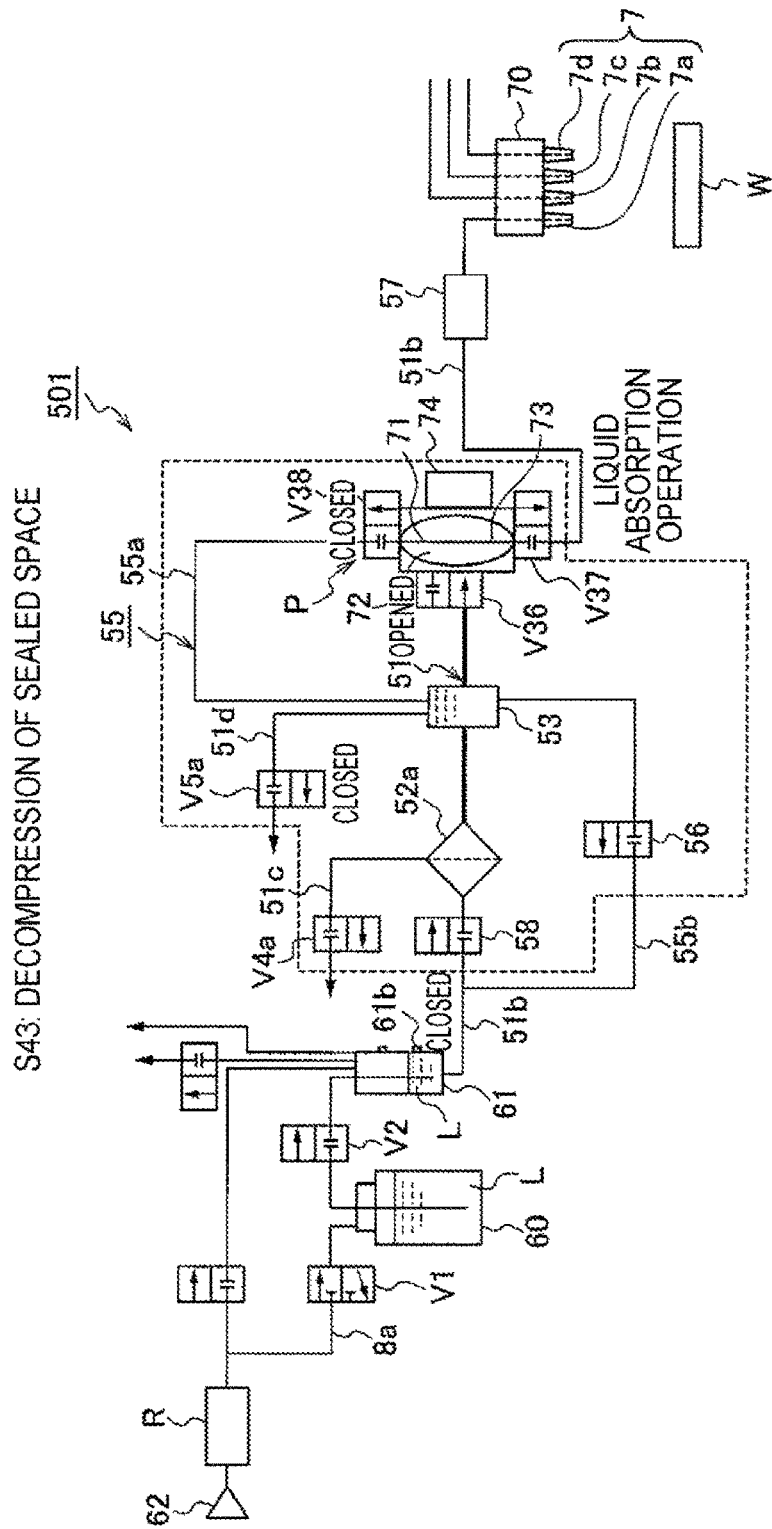
FIG. 29 is an explanatory view illustrating an operation of the resist liquid supply system.
Figure 30:
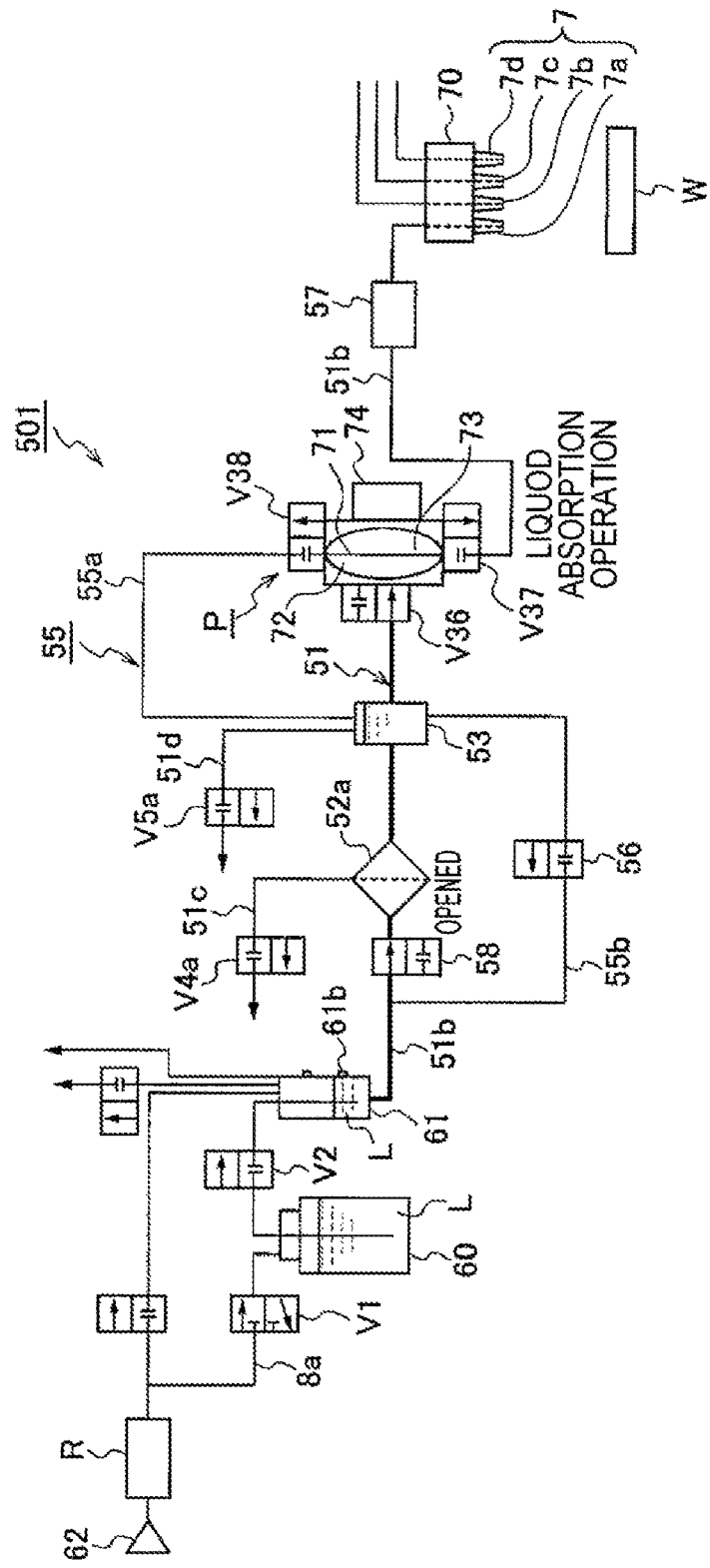
FIG. 30 is an explanatory view illustrating an operation of the resist liquid supply system.

Subsequently, the valve V5a is closed, the valve V36 at the primary side of the pump P is opened, and the liquid absorption operation of the pump P is performed. At this time, a sealed space is formed by a region ranging from the trap tank 53 to the valve 56 in the return pipe 55b, the return pipe 55a, the trap tank 53, the filter device 52a and the switching valve 58. FIG. 29 illustrates a range in which the sealed space is formed, by surrounding the range by a dotted line. The sealed space is expanded by the liquid absorption operation of the pump P, and bubbles of the resist liquid L in the sealed space are actualized as described in the first exemplary embodiment (step S43).

Thereafter, while the liquid absorption operation of the pump P is continued, the valve 58 at the primary side of the filter device 52a is opened and the resist liquid L flows to be drawn from the buffer tank 61 to the decompressed atmosphere so that the decompressed atmosphere is released. Particles of the filter 52 in the filter device 52a are flowed to the pump P by the resist liquid and removed from the filter 52f. Bubbles generated at the primary side of the trap tank 53 are collected in the trap tank 53. Bubbles generated at the secondary side of the trap tank 53 are introduced along with the resist liquid to the pump P (step S44 in FIG. 30).

Then, step S42 as illustrated in FIG. 28 is performed so that the resist liquid including the bubbles of the pump P is supplied to the trap tank 53 and the bubbles are removed from the trap tank 53 rather than from the ventilation pipe 51d. Further, the particles included in the resist liquid are also removed along with the resist liquid by the trap tank 53. After step S42 at the second time, steps S43, S44 are performed, and then, steps S42 to S44 are further performed. Steps S42 to S44 are performed repeatedly in this manner. When steps S42 to S44 are repeated a predetermined number of times, the valve 58 at the primary side of the filter device 52a and the valve V36 at the primary side of the pump P are closed from the state of step S44, and the resist liquid supplying system 501 is in the standby state of step S41.

Figure 31:
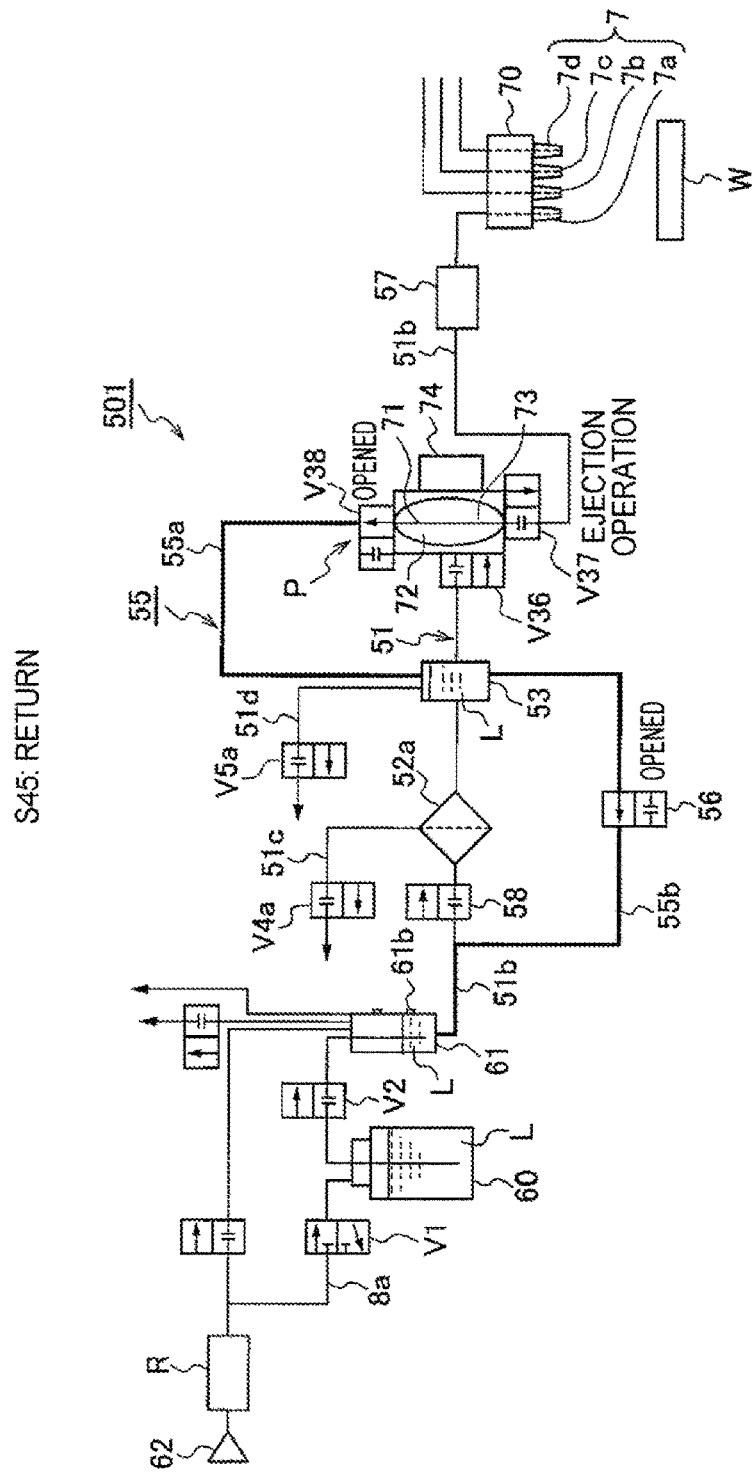
FIG. 31 is an explanatory view illustrating an operation of the resist liquid supply system.
Figure 32:
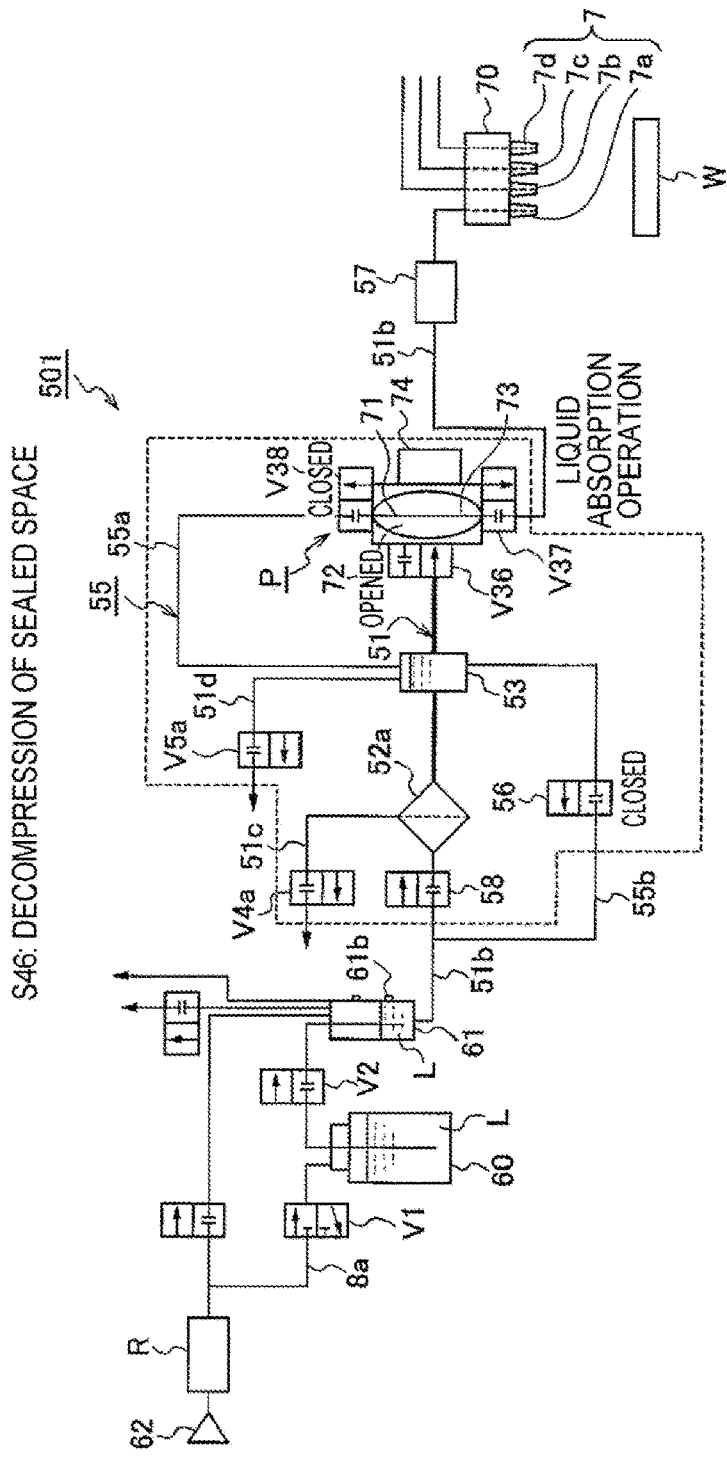
FIG. 32 is an explanatory view illustrating an operation of the resist liquid supply system.

Subsequently, as illustrated in FIG. 31, the valve V38 connected to the return pipe of the pump P and the valve 56 in the return pipe 55 are opened, the ejection operation of the pump P is performed, and the resist liquid L of the pump P is returned to the buffer tank 61 through the return pipe 55 (step S45). The resist liquid L that has returned to the buffer tank 61 is a liquid degassed by repeating steps S42 to S44. Then, the valves V38, V56 are closed, the valve V36 at the primary side of the pump P is opened as illustrated in FIG. 32, and the liquid absorption operation of the pump P is performed. As a result, a decompressed space is formed, and the degassing of the resist liquid further proceeds in the space (step S46), as in step S43.

Figure 33:
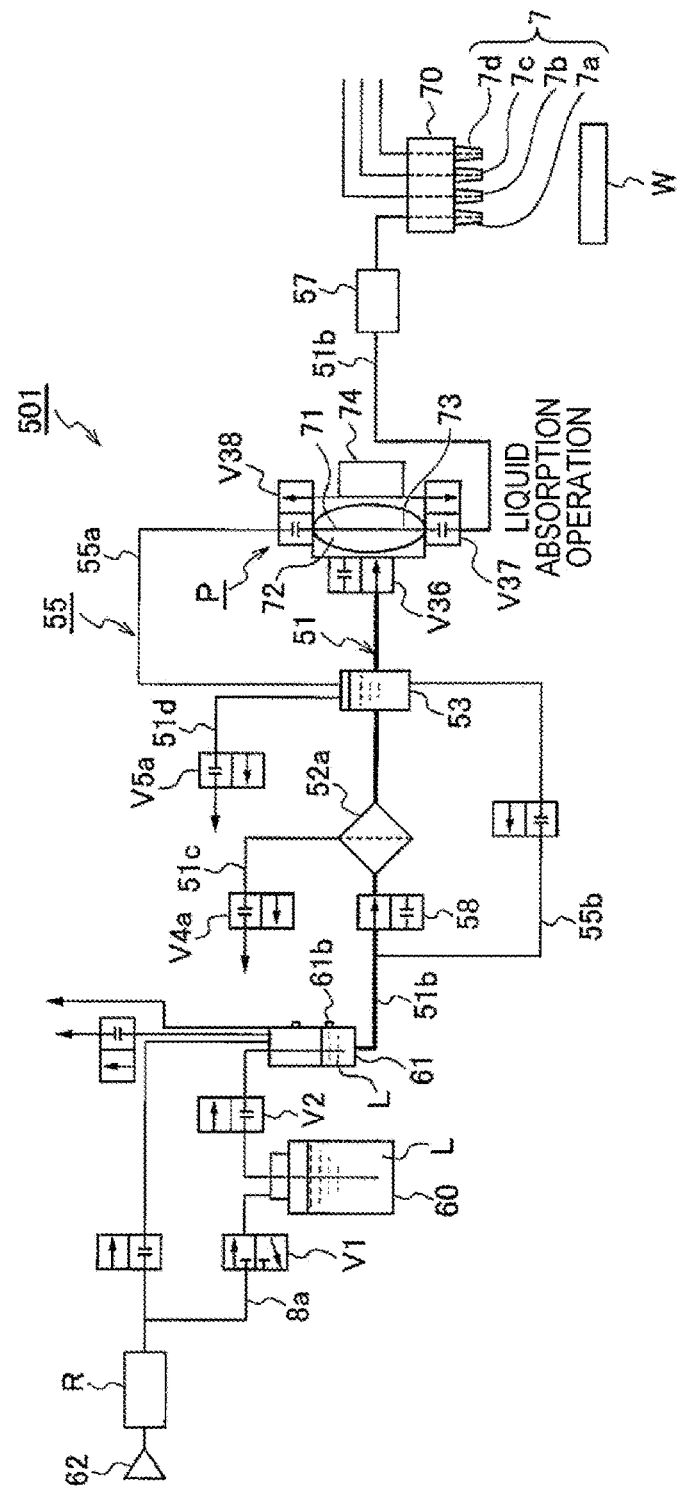
FIG. 33 is an explanatory view illustrating an operation of the resist liquid supply system.
Figure 34:
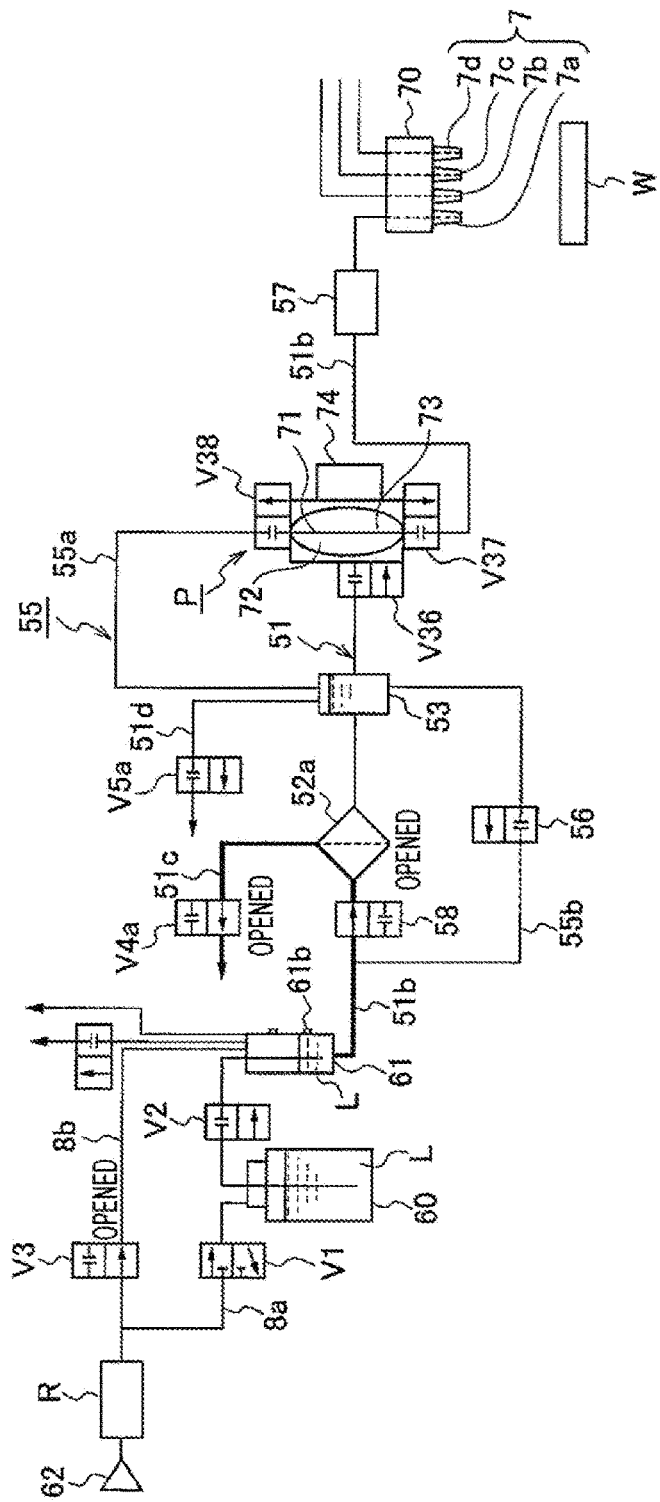
FIG. 34 is an explanatory view illustrating an operation of the resist liquid supply system.

Then, as illustrated in FIG. 33, the valve 58 at the primary side of the filter device 52a is opened in a state where the liquid absorption operation is performed, and the resist liquid flows from the buffer tank 61 into the pump P through the filter device 52a (step S47), as in step S44. The resist liquid L supplied to the filter device 52a is a liquid degassed in steps S41 to S44 as described above, and may dissolve the bubbles of the filter 52f efficiently.

Thereafter, steps S45 to S47 are performed repeatedly. The resist liquid L degassed in step S46 is returned to the buffer tank 61 in step S45, which is performed in the next turn, and is flowed through the filter device 52a in step S47 such that the bubbles of the filter device 52a is dissolved in the resist liquid L. When steps S45 to S47 are performed repeatedly a predetermined number of times, the resist liquid supplying system 501 is returned to the standby state of step S41 (see FIG. 27).

Then, the valve 58 at the primary side of the filter device 52a and the valve V4a of the ventilation pipe 51c of the filter device 52a are opened. Further, the valve V3 of the gas supply pipe 8b is opened, the inside of the buffer tank 61 is pressurized by the gas supplied from the gas supply source 62, and the resist liquid L in the buffer tank 61 is supplied to the filter device 52a such that the filter device 52a is ventilated (step S48 in FIG. 34). Thereafter, the valves 58, V4a, V3 are closed, and the resist liquid supplying system 501 is returned to the standby state.

Subsequently, the ejection processing of the resist liquid by the resist liquid supplying system 501 will be described. From the resist liquid supplying system 501 in the standby state of FIG. 27, the valves V37, 57 at the secondary side of the pump is opened, and the pump P performs the ejection operation such that the resist liquid is ejected from the nozzle unit 70. When the pump P ejects the resist liquid completely, in a state where the valves V37, 57 are closed, the valve V36 at the primary side of the pump P and the valve 58 of the filter device 52a are opened, and the pump P performs the liquid absorption operation performs such that the resist liquid is supplied from the buffer tank 61 to the pump P through the filter device 52a and the trap tank 53.

Figure 35:
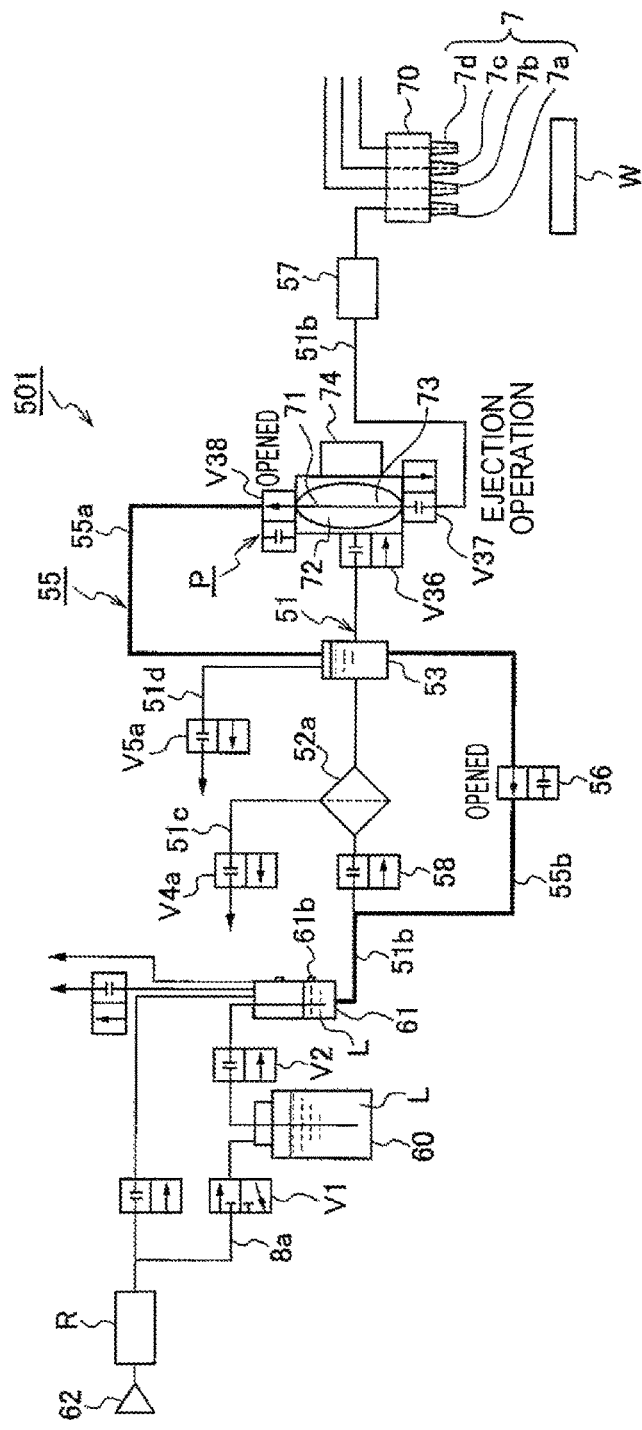
FIG. 35 is an explanatory view illustrating an operation of the resist liquid supply system.
Figure 36:
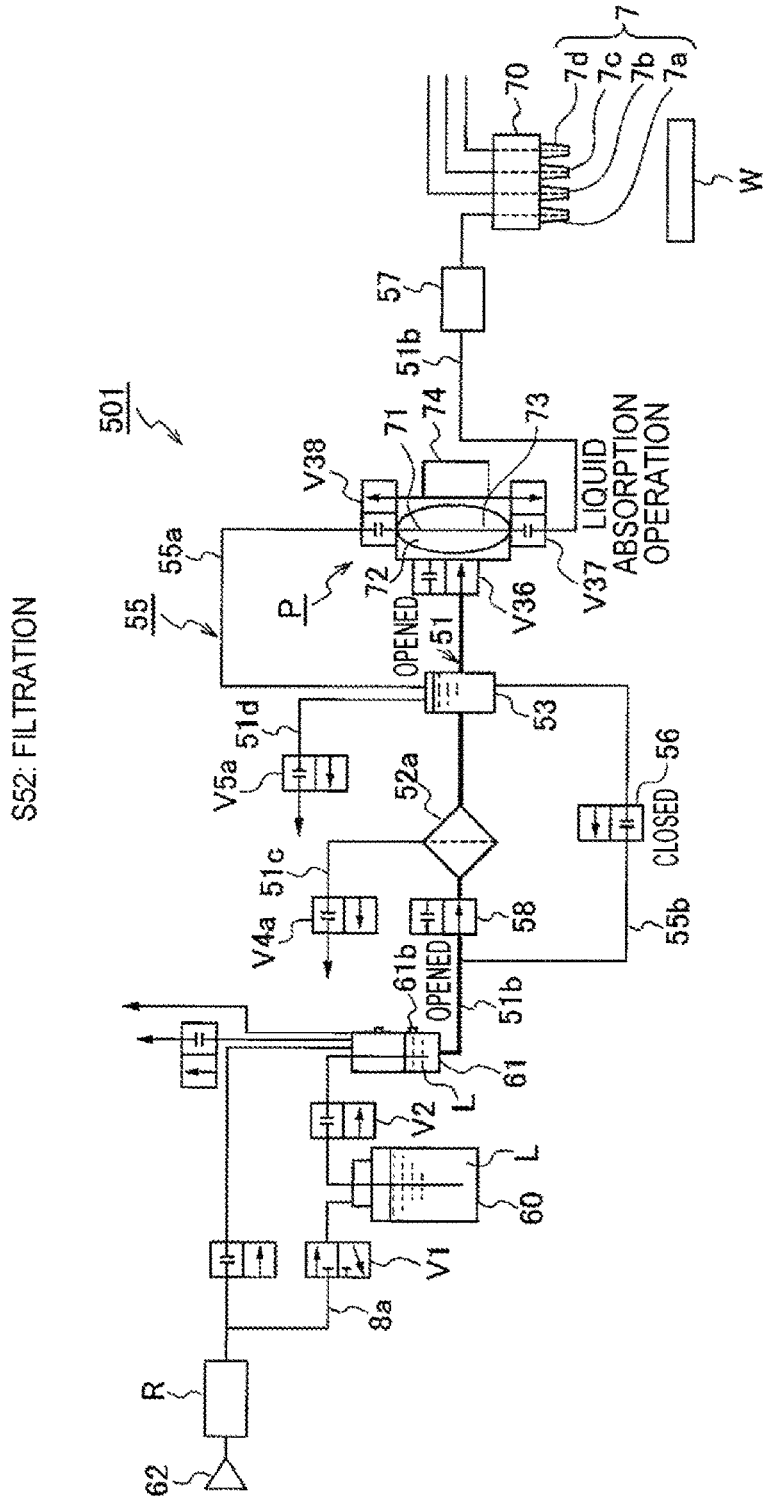
FIG. 36 is an explanatory view illustrating an operation of the resist liquid supply system.

Subsequently, the circulation and filtration processing in the resist liquid supplying system 501 will be described. From the standby state where each valve is closed, the opening and closing of the valves are performed, the ejection operation of the pump P is performed, and the resist liquid L of the pump P is returned to the buffer tank 61 through the return pipe 55 (step S51 in FIG. 35), as in step S45 (see FIG. 31) of the aforementioned degassed liquid supplying processing. The ejection amount of the pump P in step S51 is set to be equal to or more than the ejection amount with respect to a single wafer W at the time of the ejection processing in order to filter a relatively large amount of the resist liquid in the next step S52. Subsequently, the valve 56 of the return pipe 55 is closed, and the valve 58 at the primary side of the filter device 52a and the valve V36 at the primary side of the pump P are opened. As such, the opening/closing of the valves are controlled, the liquid absorption operation of the pump P is performed, and the resist liquid of the buffer tank 61 is filtered in the filter device 52a and returned to the pump P through the trap tank 53 (step S52 in FIG. 36).

Figure 37:
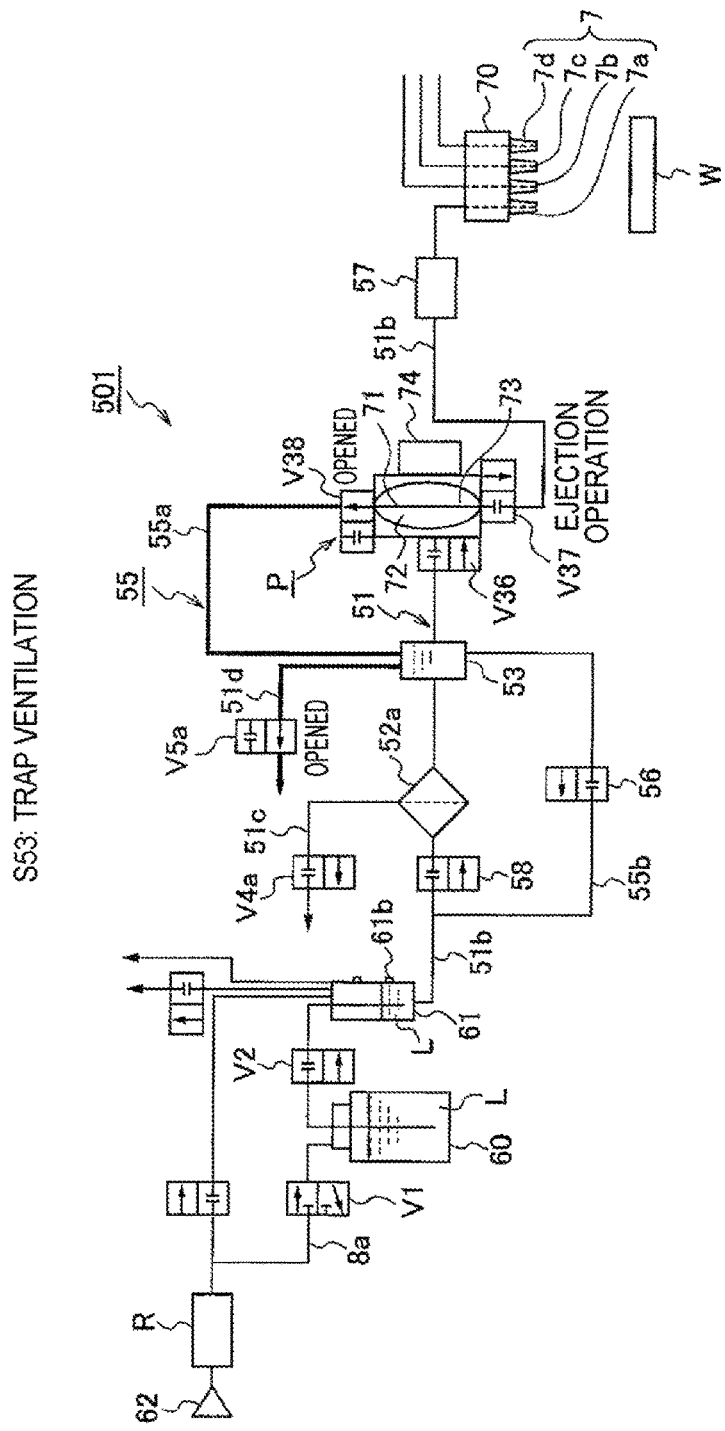
FIG. 37 is an explanatory view illustrating an operation of the resist liquid supply system.

Step S51, S52 are performed repeatedly. Assuming that steps S51, S52 are one cycle, for example, in one cycle among a plurality of cycles which are performed successively, step S53 of ventilating the trap tank 53 is performed in place of step S52. In step S53, the opening/closing of each valve is controlled, and the ejection operation of the pump P is performed (see FIG. 37), as in step S42 of the degassed liquid supplying processing. As a result, the resist liquid L of the pump P flows to the ventilation pipe 51d through the trap tank 53, and an air layer in the trap tank 53 is removed.

In the resist liquid supplying apparatus 511 of the second exemplary embodiment, the removal of bubbles in the filter device 52a may also be performed efficiently by the degassed liquid supplying processing, as in the resist liquid supplying apparatus 5 of the first exemplary embodiment. Further, the growth of particles in the filter device 52a may be suppressed by the circulation and filtration processing.

Third Exemplary Embodiment

Figure 38:
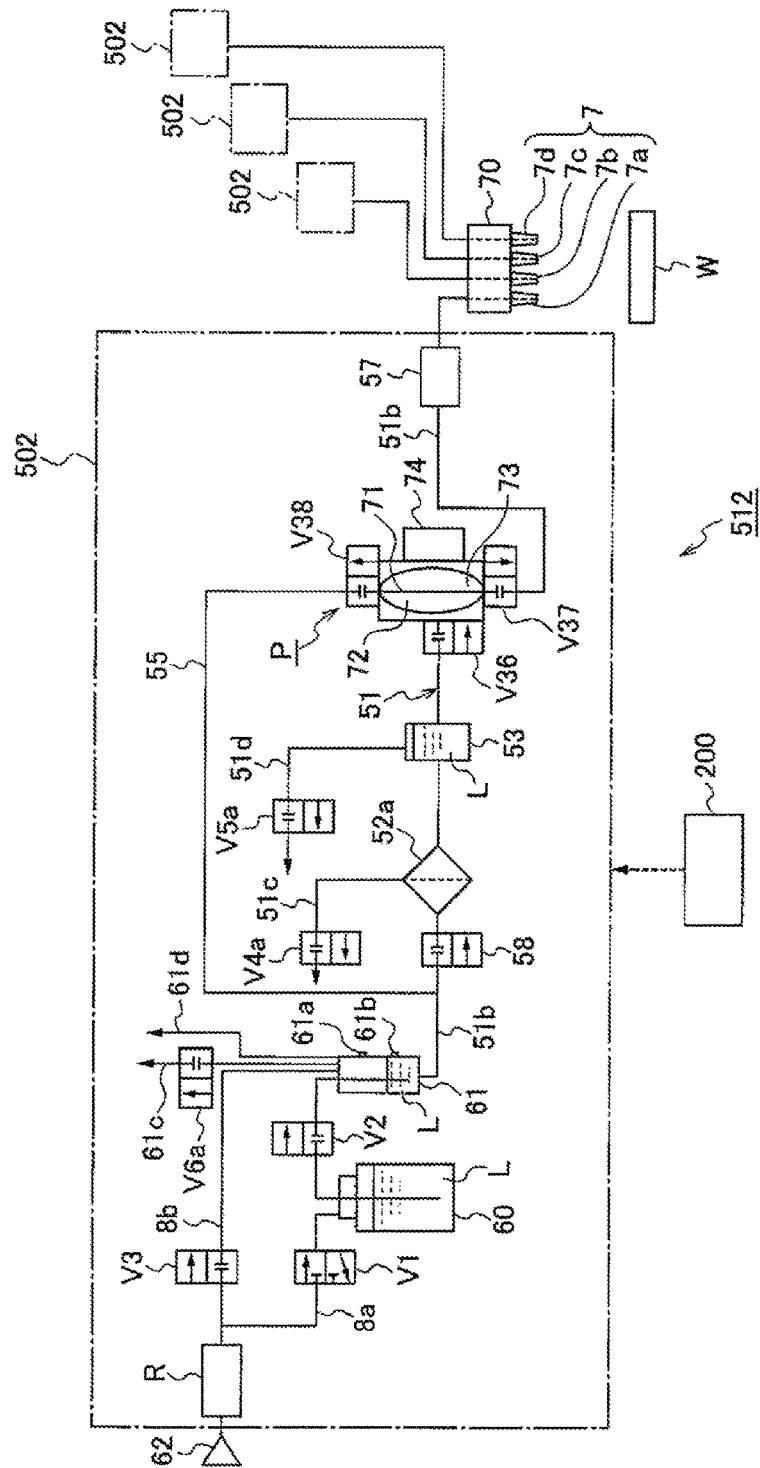
FIG. 38 is a construction view illustrating a resist liquid supply system according to another liquid processing apparatus.

FIG. 38 illustrates a resist liquid supplying apparatus 512 according to the third exemplary embodiment. The resist liquid supplying apparatus 512 is provided with resist liquid supplying systems 502 in place of the resist liquid supplying systems 501 as described in the second exemplary embodiment. A different point of the resist liquid supplying systems 502 from the resist liquid supplying systems 501 is that the return pipe 55 is not divided into pipes 55a, 55b. One end of the return pipe 55 is connected to the pump P via the valve V38, and the other end is connected to the second processing liquid supply pipe 51b between the buffer tank 61 and the valve 58. The resist liquid supplying systems 502 have the same configuration as that of the resist liquid supplying systems 501 except for the configuration of the return pipe 55.

In the resist liquid supplying systems 502 of the third exemplary embodiment, the degassed liquid supplying processing, the ejection processing of the resist liquid to the wafers W and the circulation and filtration processing are performed. The opening/closing of each valve and operations of the pump are controlled in the same manner as in the resist liquid supplying systems 501, and each step S as described in the second exemplary embodiment is performed. However, in step S51 (see FIG. 35), when the resist liquid of the pump P is returned to the buffer tank 61, the opening of the valve 56 is not performed because the valve 56 is not provided in the return pipe 55 in each resist liquid supplying system 502. In the third exemplary embodiment, the same effect as that of the second exemplary embodiment may be obtained.

Fourth Exemplary Embodiment

Figure 39:
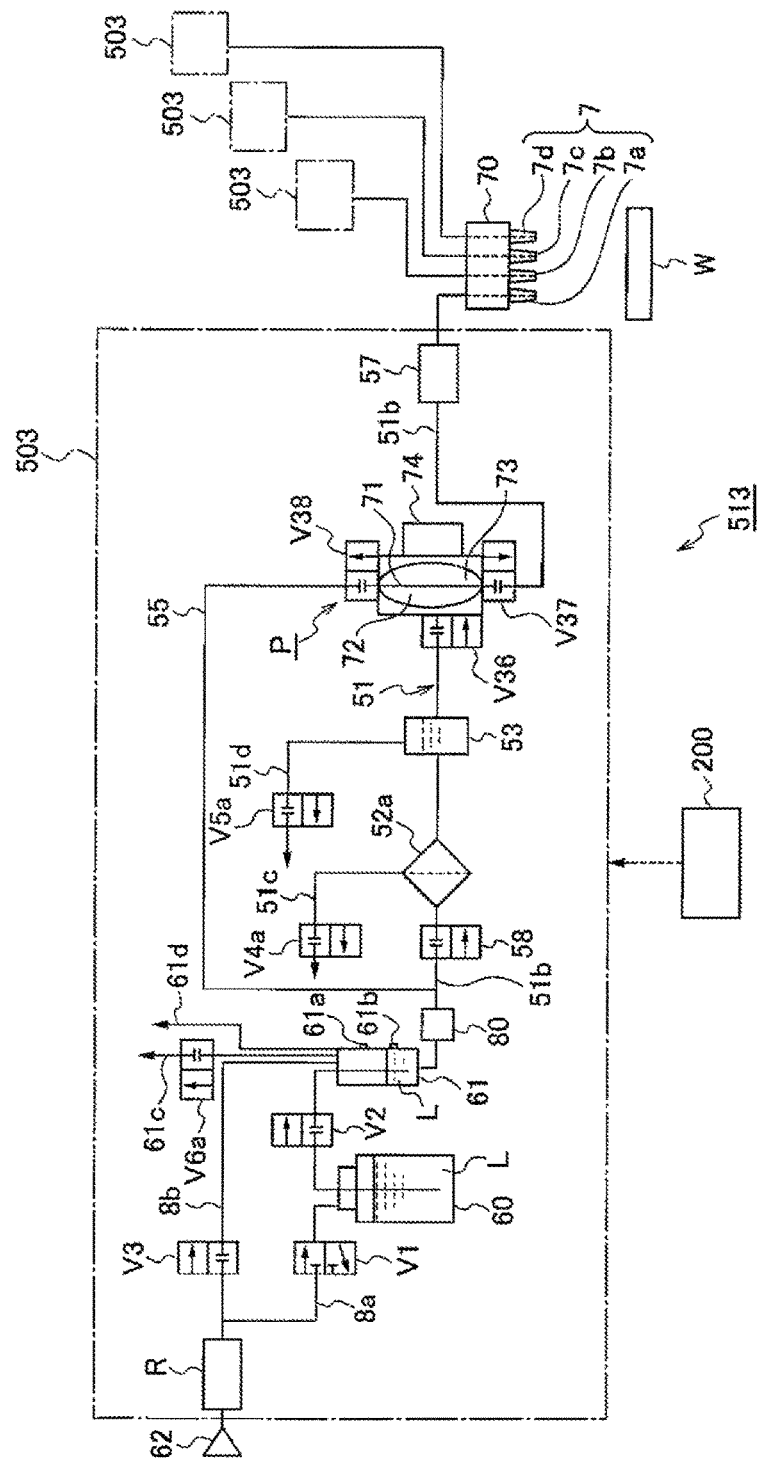
FIG. 39 is a construction view illustrating a resist liquid supply system according to another liquid processing apparatus.

There is no limit to degassing the resist liquid using the pumps P, P1 used in the ejection processing of the resist liquid. Resist liquid supplying systems 503 of a resist liquid supplying apparatus 513 as illustrated in FIG. 39 have substantially the same configuration as that of the resist liquid supplying systems 502. A different point is that a degassing mechanism 80 is interposed between the buffer tank 61 and a connection point with the return pipe 55 and the switching valve 58 is interposed downstream of the degassing mechanism 80 in the processing liquid supplying pipe 51b.

Figure 40A:
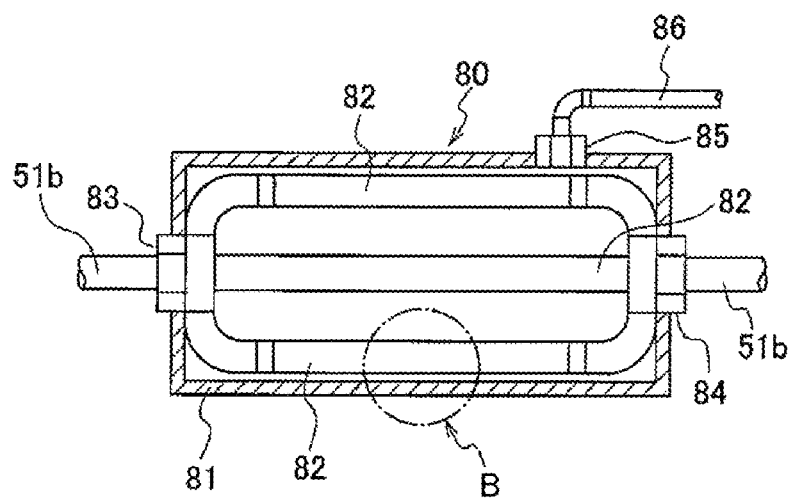
FIGS. 40A and 40B are construction views illustrating a degassing mechanism constituting the liquid processing apparatus.
Figure 40B:
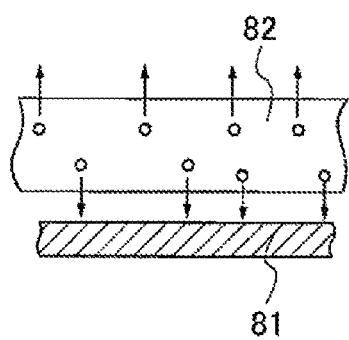

As illustrated in FIG. 40A, the degassing mechanism 80 is provided with a container 81 and a semipermeable membrane tube 82, and configured to remove gas present in the resist liquid L. Further, the container 81 is provided with an inflow port 83 and an outflow port 84 connected to the processing liquid supply pipe 51. The container 81 is further provided with an exhaust port 85 connected with a discharge pipe 86 to discharge gas present in the resist liquid L to the outside. Meanwhile, the discharge pipe 86 is connected to an exhaust pump or an exhaust ejector (not illustrated).

Meanwhile, the semipermeable membrane tube 82 is disposed in the container 81 and connected to both ports 83, 84. And, the whole portion thereof is made of, for example, an ethylene tetrafluoride- or polyolefin-based hollow fiber membrane. Therefore, air around the semipermeable membrane tube 82 is decompressed when the resist liquid L is flowed into the semipermeable membrane tube 82 during the driving of the pump and driving the exhaust pump (not illustrated) to exhaust the air around the semipermeable membrane tube 82 in the container 81. The gas in the resist liquid L is discharged to the outside of the semipermeable membrane tube 82 by driving the exhaust pump, and discharged to the outside of the degassing mechanism 80 through the discharge pipe 86.

Figure 41:
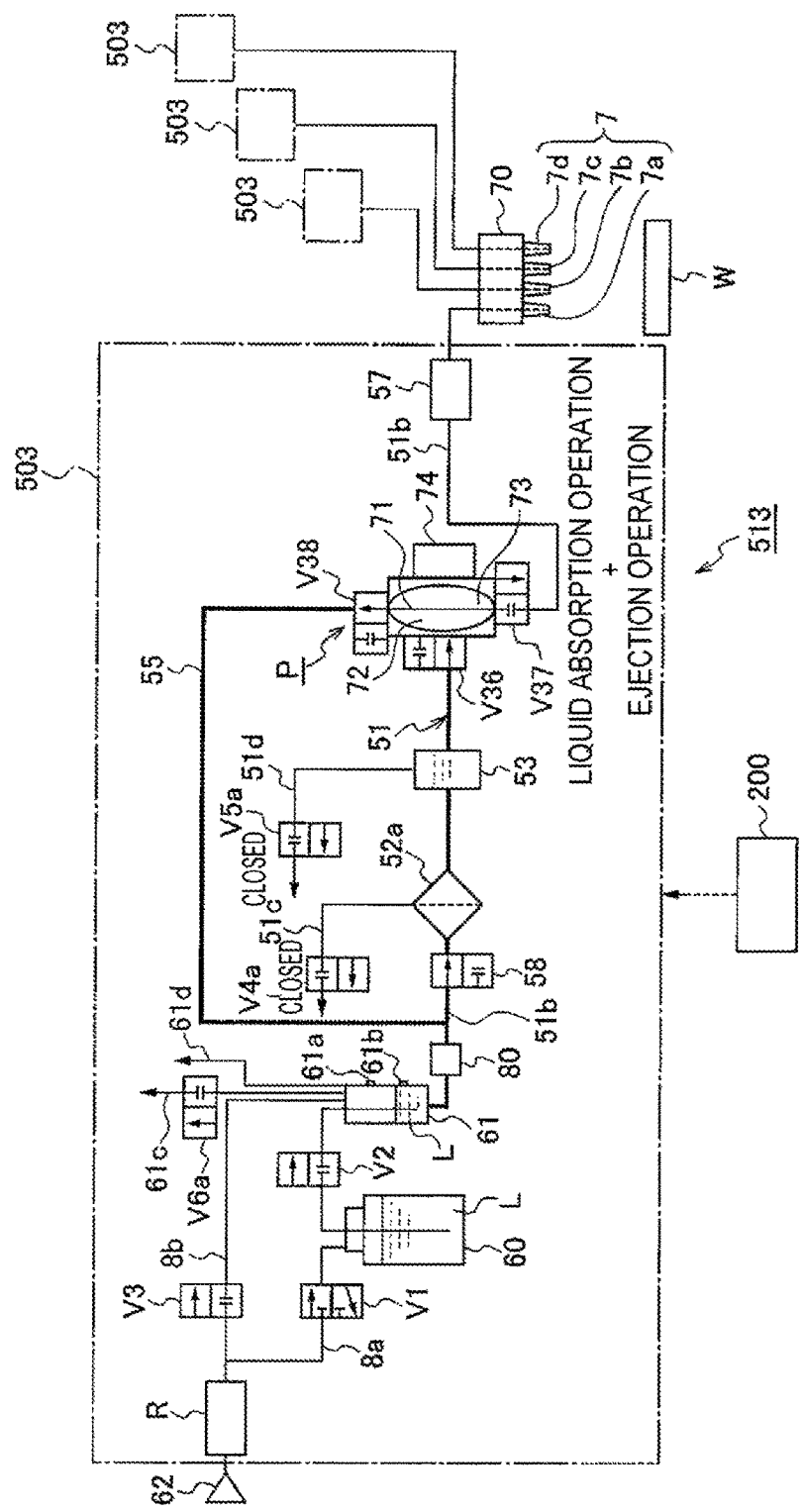
FIG. 41 is an explanatory view illustrating an operation of the resist liquid supply system of the liquid processing apparatus.

By providing the degassing mechanism 80, the degassed resist liquid L may be supplied to the downstream side of the degassing mechanism 80. The resist liquid degassed thereby is absorbed by the pump P and introduced into an annular path including the processing liquid supply pipe 51 and the return pipe 55, and the opening/closing of each valve is controlled such that the resist liquid ejected from the pump P is circulated in the annular path. Then, the ejection operation and the liquid absorption operation of the pump P are performed repeatedly a plurality of times to circulate the degassed resist liquid in the annular path repeatedly a plurality of times (see FIG. 41). That is, as in the second exemplary embodiment, the resist liquid L is returned from the pump P to the buffer tank 61 by the ejection operation of the pump P, and subsequently, the resist liquid L is drawn to the pump P by the liquid absorption operation of the pump P. These operations are repeated. In FIG. 41, the pipes in which the resist liquid flows by the ejection operation and the liquid absorption operation are illustrated thickly.

Since the filter device 52a is interposed in the annular path, the degassed resist liquid is supplied repeatedly from the primary side to the secondary side of the filter device 52a. Therefore, as in the degassed liquid supplying processing of each exemplary embodiment as described above, bubbles of the filter device 52a may be removed efficiently from the filter device 52a by dissolving the bubbles in the resist liquid.

Figure 42:
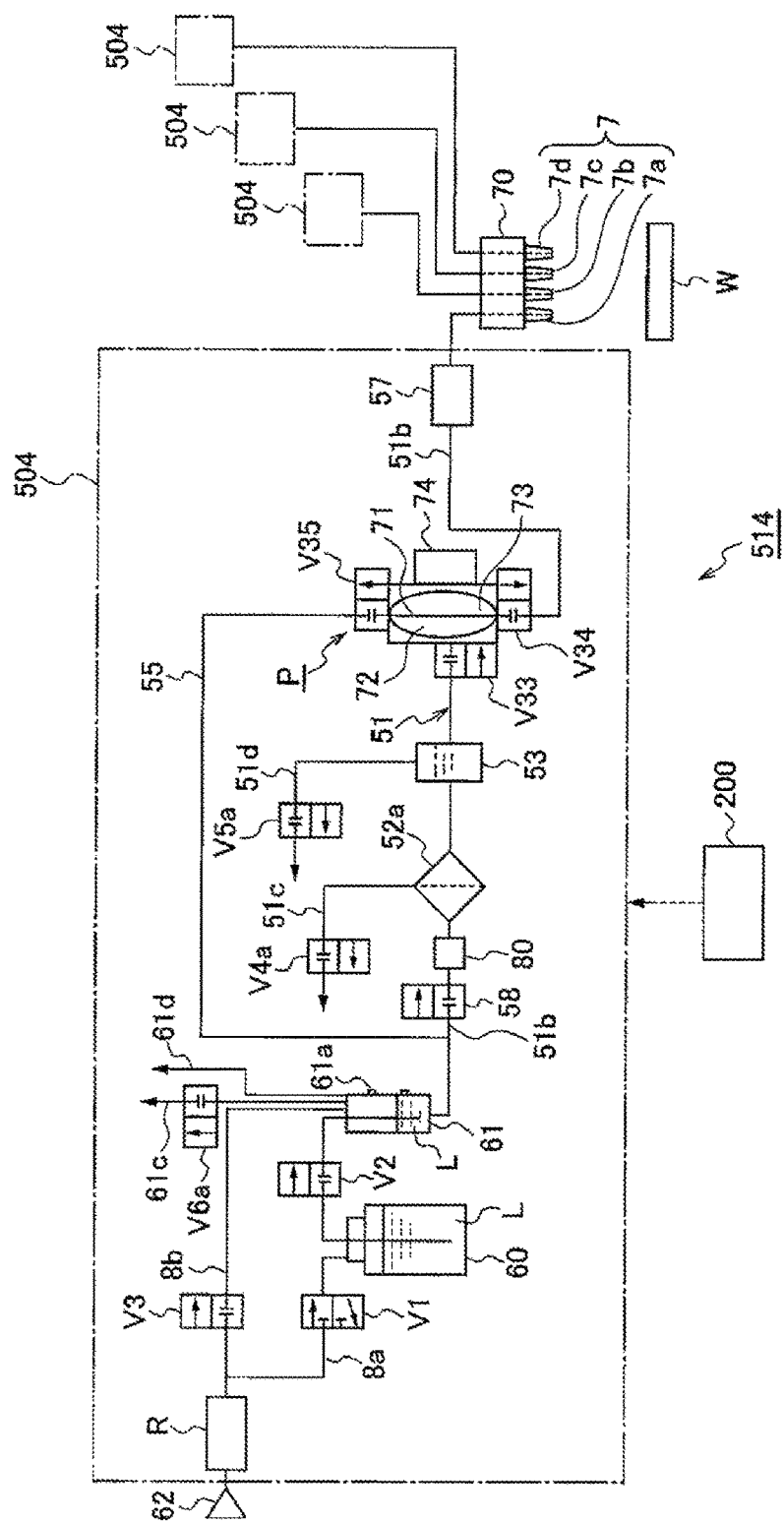
FIG. 42 is an explanatory view illustrating an arrangement example of the degassing mechanism.

Although the degassing mechanism 80 is provided outside the annular path in the example of FIG. 39, the degassing mechanism 80 may be interposed in the annular path as illustrated in FIG. 42. In each resist liquid supplying system 504 of the apparatus 514 in FIG. 42, the degassing mechanism 80 is provided between the primary side of the filter device 52a and the connection point with the return pipe 55 in the second processing liquid supply pipe 51b. In addition, as in the example as illustrated in FIG. 41, the resist liquid is circulated in the annular path.

However, in the first exemplary embodiment, a decompressed space is formed in the pumps P1, P2 and the filter device 52a in order to degas the resist liquid by the operations of the pumps. In the second and third exemplary embodiments, a decompressed space is formed in the filter device 52a, the trap tank 53 and the pump P. The region where the decompressed space is formed is not limited thereto.

Figure 43:
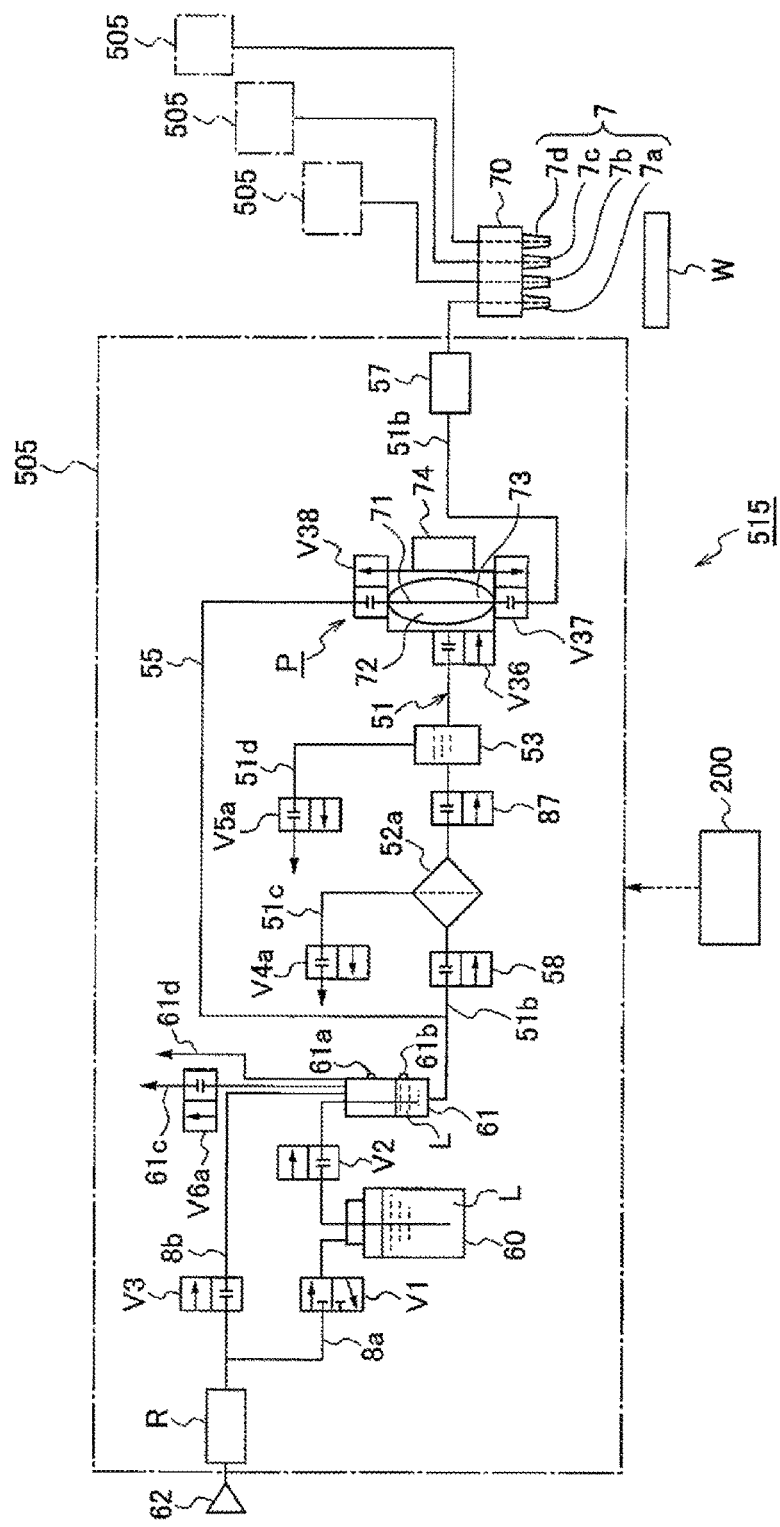
FIG. 43 is a view illustrating a configuration of a resist liquid supply system according to another liquid processing apparatus.

A resist liquid supplying apparatus 515 of FIG. 43 is a modification of the third exemplary embodiment. Unlike the resist liquid supplying systems 502 of the third exemplary embodiment, in resist liquid supplying systems 505 of the resist liquid supplying apparatus 515, a switching valve 87 is interposed in a pipe between the filter device 52a and the trap tank 53. When the resist liquid is degassed, the valve V36 at the primary side of the pump P is opened, and the valves V37, V38 at the secondary side of the pump P, the switching valve 87, the valve V5a of the trap tank 53 and the valve V4a of the filter device 52a are closed. Accordingly, the pump P, the trap tank 53 and the region of the processing liquid supplying pipe 51 ranging from the pump P to the switching valve 87 become a sealed space, and the sealed space is decompressed when the pump P performs the absorption operation. Then, as in other exemplary embodiments, the resist liquid degassed in the sealed space is flowed from the primary side to the secondary side of the filter device 52a through the return pipe 55 to remove the bubbles of the filter device 52a.

Besides, the resist liquid may be degassed by setting only the inside of the pump P as a sealed space. For example, in the resist liquid supplying systems 505, the valves V36, V37, V38 are closed in a state where the pump P does not eject the resist present therein completely, and the pump P performs the liquid absorption operation. As a result, the resist liquid may be degassed by setting the inside of the pump P as a decompressed space. However, as the decompressed space is constituted more widely, the amount of the resist liquid, which may be degassed when the pump is once, is increased. Accordingly, more degassed resist liquid may be supplied to the filter device 52a in a short period of time and the bubbles may be removed rapidly. Therefore, as in each of the exemplary embodiments described above, the resist liquid supplying systems may be configured such that, in addition to the pump P, the filter device 52a or the trap tank 53 may also be set as a decompressed space.

In the degassed liquid supplying processing of each exemplary embodiment as described above, the return pipe 55 provided separately from the processing liquid supplying pipe 51 is used to return the degassed resist liquid at the secondary side of the filter device 52a to the primary side of the filter device 52a and flow the resist liquid from the primary side to the secondary side of the filter device 52a. However, the degassed liquid supplying processing is not limited to using the return pipe 55 to return the resist liquid to the primary side of the filter device 52a.

Figure 44:
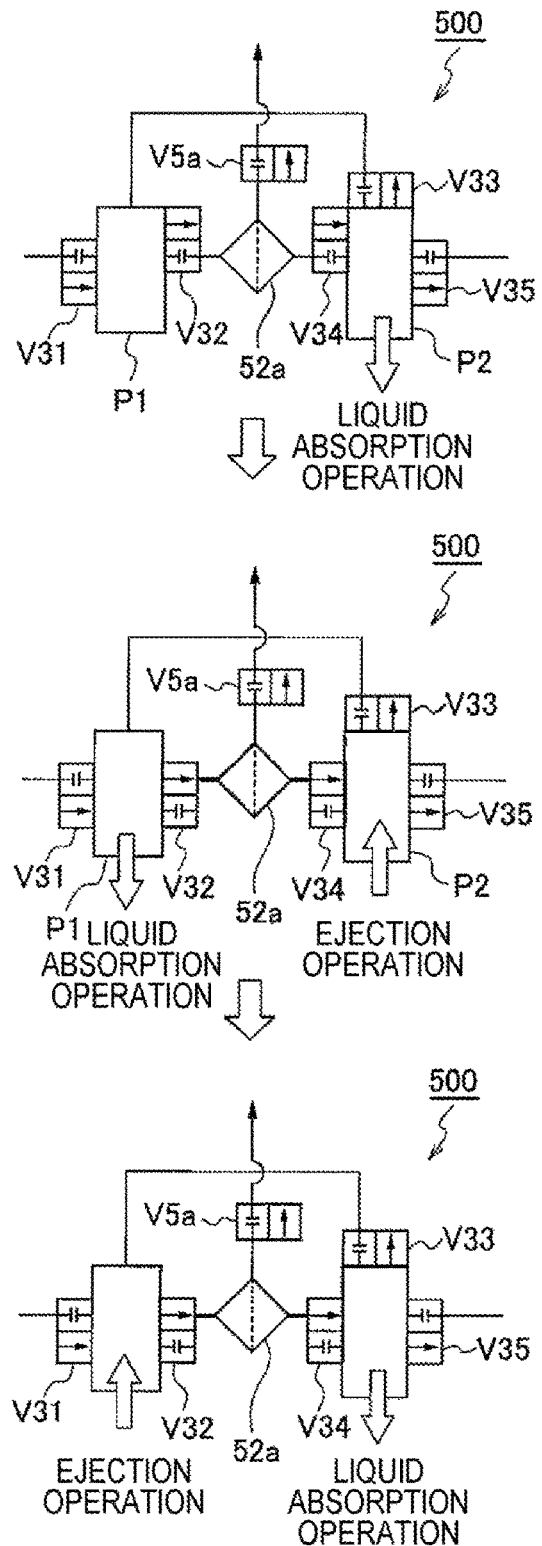
FIG. 44 is an explanatory view illustrating an operation of the resist liquid supply system.

FIG. 44 illustrates the pumps P1, P2 and the filter device 52a of the resist liquid supplying system 500 of the first exemplary embodiment. In a state where the resist liquid is stored in the ejection pump P2, the valves V33 to V35 of the ejection pump P2 are closed, the inside of the ejection pump P2 is set as a closed space, and the liquid absorption operation of the ejection pump P2 is performed (see the upper portion in FIG. 44). Accordingly, the resist liquid in the ejection pump P2 is degassed. Subsequently, the valve V34 and the valve 32 of the supply pump are opened. Then, the liquid absorption operation of the supply pump P1 is performed, the ejection operation of the ejection performed, and the degassed resist liquid is flowed from the ejection pump P2 to the supply pump P1 through the filter device 52a (see the middle portion in FIG. 44). Thereafter, the ejection operation of the supply pump P1 is performed, the liquid absorption operation of the ejection pump P2 is performed, and the degassed resist liquid is flowed from the primary side to the secondary side of the filter device 52a. However, according to the flowing method, since the resist liquid is flowed from the secondary side to the primary side of the filter device 52a, the return pipe 55 is used as described above from the viewpoint of suppressing the outflow of the particles from the filter device 52a.

The configuration of the resist liquid supplying systems is not limited to the aforementioned exemplary embodiments. For example, in the first exemplary embodiment of FIG. 3, the trap tank 53 may be provided between the resist container 60 and the supply pump P1. The trap tank 53 may be provided between each of the pumps P1, P2 and the filter device 52a, or may be provided between the pump P2 and the supply control valve 57. Further, in the second exemplary embodiment of FIG. 27, the trap tank 53 may not be provided at a position as illustrated in the figure, and the resist liquid may be supplied from the pump P directly to the primary side of the filter device 52a. Further, the trap tank 53 may be provided between the pump P and the supply control valve 57. As described above, the trap tank 53 may be disposed at any position in each resist liquid supplying system. Further, in FIG. 27, the filter device 52a is disposed upstream of the pump P. However, the filter device 52a may be disposed downstream of the pump P.

As another method of degassing a resist liquid, for example, in the first exemplary embodiment (see FIG. 3), the valve V31 is opened and the valves V32, V33, V6a, V2 are closed so as to form a sealed space in the supply pump P1 and the buffer tank 61. Then, the liquid absorption operation of the supply pump P1 is performed such that the sealed space is decompressed and the resist liquid is degassed. That is, in the first exemplary embodiment, the resist liquid may be degassed by using any one of the pumps P1, P2. Further, in the first exemplary embodiment, when the sealed space is formed, the valve V35 near the ejection pump P2 is used, but the supply control valve 57 may be used to form a sealed space without providing the valve 35. However, bubbles are generated in the pipe ranging from the pump P2 to the supply control valve 57. In order to suppress the bubbles from being supplied to the wafers W, a valve closer to the ejection pump P2, that is, the valve V35 may be used to form a sealed space.

Meanwhile, the exemplary embodiments have been described with respect to a case where the processing liquid supplying apparatus according to the present disclosure is applied to a resist coating processing apparatus. However, the processing liquid supplying apparatus according to the present disclosure may also be applicable to a supplying apparatus of a processing liquid other than the resist liquid, such as, for example, a developer, or a supplying apparatus for a cleaning processing.

Fifth Exemplary Embodiment

Figure 45:
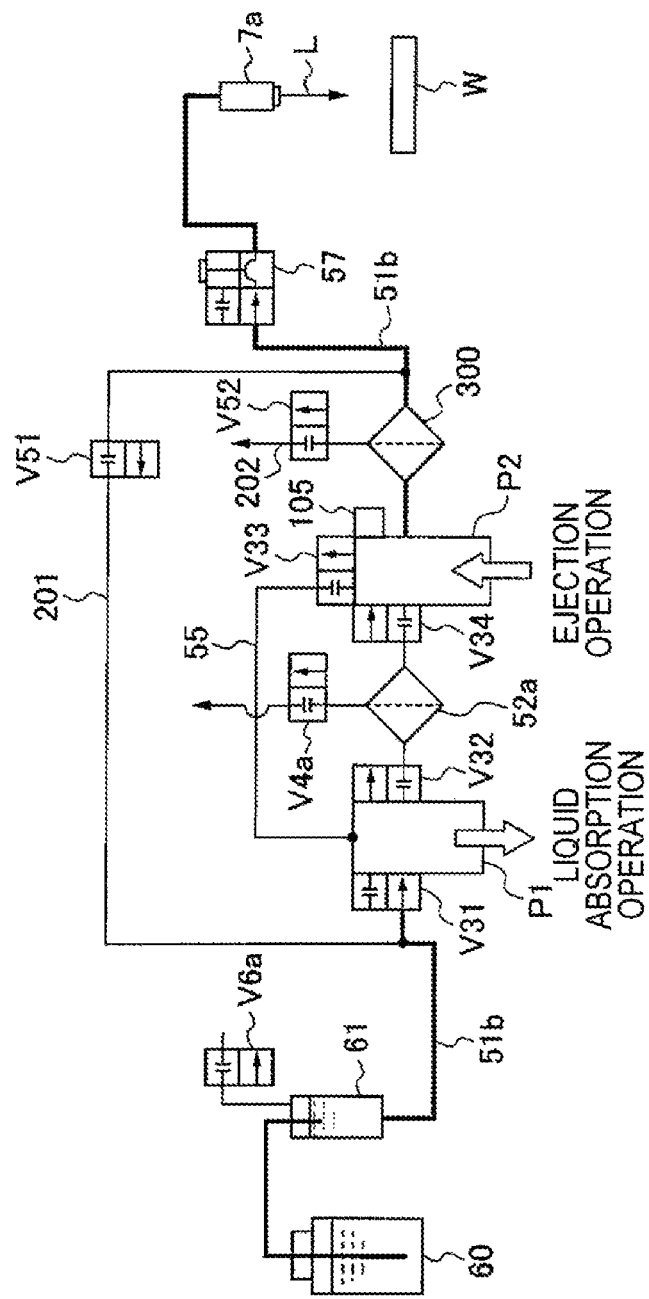
FIG. 45 is a view illustrating a configuration of a resist liquid supply system according to another liquid processing apparatus.

As illustrated in FIG. 45, the fifth exemplary embodiment shows an example where, in addition to the aforementioned filter device 52*a*, another filter device 300 is provided at the secondary side of the ejection pump P2. One end of a return pipe 201 is connected to a second processing liquid supply pipe 51*b* between the filter device 300 and a supply control valve 57. The other end of the return pipe 201 is connected to the second processing liquid supply pipe 51*b* between a buffer tank 61 and a supply pump P1 through a valve V51. Meanwhile, in FIG. 45, reference numeral "202" denotes a ventilation pipe configured to discharge bubbles from the filter device 300, and reference numeral "V52" denotes a valve provided in the ventilation pipe 202.

FIG. 45 illustrates an aspect in which a resist liquid L is ejected from a nozzle 7*a*, and a supply pump P1 is replenished with the resist liquid L from the buffer tank 61 in the fifth exemplary embodiment. At this time, valves V51, V52 are closed. Meanwhile, the descriptions of the passing operation of the resist liquid L to the filter device 52*a* following the ejection operation of the resist liquid L, or the opening/closing of valves V31 to V34 and the supply control valve 57 in each operation are omitted because the descriptions thereof are overlapped with those of the first exemplary embodiment as described above. However, in the present exemplary embodiment, the valve V35 of the ejection pump P2 is not provided, and the sealed space is formed by the supply control valve 57 instead of the valve V35.

Figure 46:
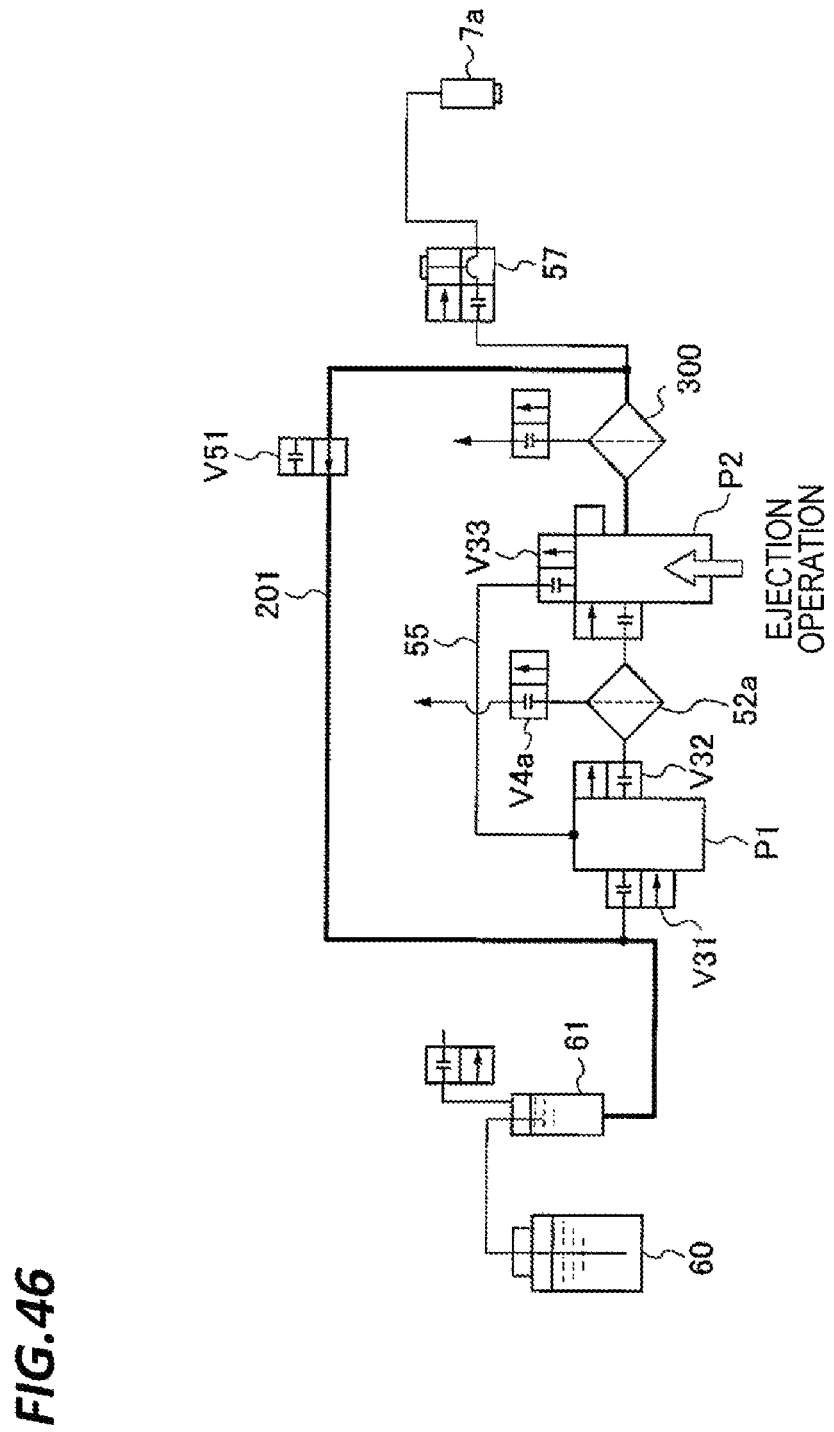
FIG. 46 is a view illustrating the configuration of the resist liquid supply system.

And, when the resist liquid L is returned to a primary side of the supply pump P1, the valve V51 of the return pipe 201 is opened and the other valves V31 to V33 and the supply control valve 57 are closed, as illustrated in FIG. 46. In this state, the ejection operation of the ejection pump P2 is performed, and the resist liquid L in the ejection pump P1 passes through the filter device 300 and reaches a secondary side of the buffer tank 61 via the return pipe 201.

In the fifth exemplary embodiment, when the resist liquid L is flowed to the nozzle 7*a*, the resist liquid L passes through the filter device 300. Accordingly, for example, even in a case where particles are generated, a clean resist liquid L may be supplied to wafers by collecting the particles. Further, even when the resist liquid L in the ejection pump P2 is returned to the primary side of the supply pump P1, the resist liquid passes through the filter device 300. Therefore, even if particles are also generated in the ejection pump P2, the particles may be collected.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A processing liquid supplying apparatus comprising:
a processing liquid supply source configured to supply a processing liquid for processing a substrate to be processed;
an ejection unit connected to the processing liquid supply source through a supply path and configured to eject the processing liquid to the substrate;
a filter device provided in the supply path and configured to remove foreign matters in the processing liquid;
a supply pump and an ejection pump which are provided in the supply path at a primary side and a secondary side of the filter device, respectively;
a circulation path connected between the supply pump and the ejection pump; and
a control unit programmed to output a control signal to:
supply the processing liquid to the supply pump, the filter device, the ejection pump, the supply path from the ejection pump to the ejection unit, and the circulation path by using at least one of the supply pump and the ejection pump;
ventilate the filter device by using the supply pump;
decompress and degas the processing liquid supplied from the processing liquid supply source by using the ejection pump such that bubbles dissolved in the processing liquid are generated;
pass the degassed processing liquid through the filter device from the primary side to the secondary side of the filter device by using the supply pump and the ejection pump such that bubbles existing in the filter device are dissolved in the degassed processing liquid, the bubbles generated from the processing liquid are accumulated in the filter device to form an air layer, and the foreign matters adhered in the filter device flow toward the ejection pump;
return the degassed processing liquid from the ejection pump toward the supply pump through the circulation path by using the ejection pump such that the degassed processing liquid is purged to the primary side of the filter device through the circulation path along with the foreign matters and the bubbles generated from the processing liquid; and
repeat, sequentially, to supply the processing liquid, to ventilate the filter device, to decompress and degas the processing liquid, to pass the degassed processing liquid, to return the degassed processing liquid through the circulation path, a plurality of times.

2. The processing liquid supplying apparatus of claim 1, wherein after the supply pump, the filter device, and the ejection pump are filled with the processing liquid, the control unit is further programmed to output a control signal to establish a space ranging from the supply pump to the ejection pump as a closed decompressed space, stop movement of a driving unit of one of the supply pump and the ejection pump, and cause the other pump to perform an absorption operation, thereby decompressing and degassing the processing liquid.

3. The processing liquid supplying apparatus of claim 2, wherein the control unit is further programmed to output a control signal to return the decompressed and degassed processing liquid from the ejection pump to the supply pump through the filter device.

4. A processing liquid supplying method in which a processing liquid for processing a substrate to be processed is supplied from a processing liquid supply source to the substrate through a supply path after passing through a filter device to remove foreign materials, the method comprising:

providing a supply pump and an ejection pump which are provided in the supply path at a primary side and a secondary side of the filter device, respectively;

providing a circulation path connected between the supply pump and the ejection pump, supplying the processing liquid to the supply pump, the filter device, the ejection pump, the supply path from the ejection pump to the ejection unit, and the circulation path by using at least one of the supply pump and the ejection pump;

ventilating the filter device by using the supply pump;

decompressing and degassing the processing liquid supplied from the processing liquid supply source by using the ejection pump such that bubbles dissolved in the processing liquid are generated;

passing the degassed processing liquid through the filter device from the primary side to the secondary side of the filter device by using the supply pump and the ejection pump such that bubbles existing in the filter device are dissolved in the degas sed processing liquid, the bubbles generated from the processing liquid are accumulated in the filter device to form an air layer, and the foreign matters adhered in the filter device flow toward the ejection pump;

returning the degassed processing liquid from the ejection pump toward the supply pump through the circulation path by using the ejection pump such that the degassed processing liquid is purged to the primary side of the filter device through the circulation path along with the foreign matters and the bubbles generated from the processing liquid;

repeating, sequentially, to supply the processing liquid, to ventilate the filter device, to decompress and degas the processing liquid, to pass the degassed processing liquid, to return the degassed processing liquid through the circulation path, a plurality of times; and ejecting the processing liquid at the secondary side of the filter device to the substrate through an ejection unit by the ejection pump.

5. The processing liquid supplying method of claim 4, wherein the decompressing and degassing includes:

causing a space ranging from the supply pump to the ejection pump to be established as a closed decompressed space;

causing movement of a driving unit of one of the supply pump and the ejection pump to be stopped; and causing the other pump to perform an absorption operation, after the supply pump, the filter device, and the ejection pump are filled with the processing liquid.

6. The processing liquid supplying method of claim 4, further comprising:

returning the decompressed and degassed processing liquid from the ejection pump to the supply pump through the filter device.

* * * * *